United States Patent [19]
Nakagawa et al.

[11] Patent Number: 6,127,098
[45] Date of Patent: *Oct. 3, 2000

[54] METHOD OF MAKING RESIST PATTERNS

[75] Inventors: Kenji Nakagawa; Ei Yano; Akira Oikawa; Masao Kanazawa; Hiroshi Kudo, all of Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/955,371

[22] Filed: Oct. 21, 1997

Related U.S. Application Data

[63] Continuation of application No. 08/369,500, Jan. 6, 1995, abandoned.

[30] Foreign Application Priority Data

Feb. 24, 1994 [JP] Japan ..................................... 6-027013

[51] Int. Cl.$^7$ ........................................................ G03F 7/40
[52] U.S. Cl. .......................... 430/315; 430/324; 430/326; 430/328; 430/313; 430/314
[58] Field of Search .................................... 430/324, 326, 430/328, 315, 313, 314

[56] References Cited

U.S. PATENT DOCUMENTS

| | | | |
|---|---|---|---|
| 4,187,331 | 2/1980 | Hsioh-Lien Ma | 430/328 |
| 4,343,876 | 8/1982 | Heirt et al. | 430/313 X |
| 4,425,473 | 1/1984 | Mizutani et al. | 549/363 |
| 4,840,876 | 6/1989 | Arai | 430/328 |
| 5,096,802 | 3/1992 | Hu . | |
| 5,234,793 | 8/1993 | Sebald et al. | 430/323 |

FOREIGN PATENT DOCUMENTS

| | | |
|---|---|---|
| 0 130 581 | 1/1985 | European Pat. Off. . |
| 0 395 917 | 11/1990 | European Pat. Off. . |
| 0 492 253 | 7/1992 | European Pat. Off. . |
| 31 03 779 | 8/1992 | Germany . |
| 301 233 | 10/1992 | Germany . |
| 2-63059 | 3/1990 | Japan . |
| 5-241348 | 9/1993 | Japan . |

OTHER PUBLICATIONS

George R. Misium et al, Silicon Diffusion Characteristics of Different Surface Imaging Resists, SPIE, vol. 1262 Advances in Resist Technology and Processing VII (1990) pp. 74–83.

8226 Microelectronics Engineering 11(1990) Apr., No. 3 1/4, Amsterdam, NL re: "Chemical Amplification of Resist Lines (Carl)". Sebald et al.

362 Japanese Journal of Applied Physics 32(1993) Jan. 15, No. 1A/B, Part 2, Tokyo, Japan; re: "Plasma Swelling of Photoresist". Kuo.

European Search Report dated Nov. 16, 1995; Ref. No. J11093 3432 21 citing above listed references.

Primary Examiner—Cynthia Hamilton
Attorney, Agent, or Firm—Armstrong, Westerman, Hattori, McLeland & Naughton

[57] ABSTRACT

A method of forming a resist pattern including the steps of: forming a resist film by coating resist on the surface of a member to be processed, the resist containing a composition A capable of increasing the volume by chemical reaction; exposing and developing the coated resist film to form a pattern having an opening; and chemically reacting fluid containing a composition B with the composition A by contacting the fluid with the composition A to change the size of the opening of the resist film, the composition B being capable of increasing the volume of the composition A by chemical reaction with the composition A. It is possible to form a fine resist pattern by a simple method.

20 Claims, 30 Drawing Sheets

METHOD OF MAKING RESIST PATTERNS

This application is a CONTINUATION of application Ser. No. 08/369,500 filed Jan. 6, 1995, now abandoned.

BACKGROUND OF THE INVENTION a) Field of the Invention

The present invention relates to a method of making resist patterns, and more particularly to a method of making resist patterns by changing resist patterns after development.

Degree of integration and pattern sizes of semiconductor integrated circuits (IC) are becoming more serious and critical. IC manufacturing technique demands for patterns of finer size. 64 Mb DRAMs require a pattern size of 0.3 to 0.4 $\mu$m.

b) Description of the Related Art

A resist pattern is generally formed by selectively applying ultraviolet rays to a coated resist film to expose it and by selectively developing and removing the exposed or unexposed regions of the resist film. Exposure is performed by reducing the size of a pattern on a mask (reticle) by, for example, ⅕ by a projector lens and focusing the reduced pattern on a resist film. A resolution is determined by a wavelength of ultraviolet light, an numerical aperture of a projecting lens, and other parameters.

In order to improve a resolution, either a large numerical aperture or a short wavelength is used. However, a large numerical aperture makes a depth of focus shallow. A depth of focus is required to be deeper than a certain value in order to realize high precision exposure on a substrate having steps.

The remaining approach is to shorten the wavelength of ultraviolet light. The wavelength of exposure light has shortened from g-line to i-line of mercury, and from KrF laser beams to ArF laser beams. The more the wavelength becomes short, the more the conditions to be satisfied by optical elements and other devices become severe.

Another approach to improving a resolution is phase shift exposure. Light having a different phase from an exposure main beam is superposed on a pattern edge portion extending by diffraction of the main beam. Interference of the light with the main beam reduces a light intensity so that an unsharp pattern can be avoided. The structure of a mask, however, becomes complicated because it is necessary to use two or more beams having different phases.

As described above, although finer resist patterns have been desired, it is not so easy to realize such patterns.

SUMMARY OF THE INVENTION

It is an object of the present invention to provide a method of forming a fine resist pattern capable of forming the pattern in a relatively simple manner.

According to one aspect of the present invention, there is provided a method of forming a resist pattern including the steps of forming a resist film by coating resist on the surface of a member to be processed, the resist containing a composition A capable of increasing the volume by chemical reaction, exposing and developing the coated resist film to form a pattern having an opening, and chemically reacting fluid containing a composition B with the composition A by contacting the fluid with the composition A to change the size of the opening of the resist film, the composition B being capable of increasing the volume of the composition A by chemical reaction with the composition A.

After a resist film containing the composition A is exposed and developed to form an opening, fluid containing the composition B is contacted with the resist film to chemically react the composition A in the resist film with the composition B and to expand the volume of the resist film. As the volume of the resist film expands, the size of the opening reduces. In this manner, an opening smaller than the opening obtained by exposure and development can be formed.

A fine resist pattern can thus be formed easily.

DETAILED DESCRIPTION OF THE PREFERRED EMBODIMENTS

The inventors have found that the volume of a resist film formed on the surface of a subject to be processed can be expanded by a chemical reaction.

Of high performance resist films widely used nowadays, a resist film which can be developed by alkaline aqueous solution is known. For example, such resist is novolac-based positive resist. Such resist contains a great number of hydroxyl-groups of phenol compounds. When hydroxyl-groups chemically react with a certain reactant, the composition of resist changes and its volume increases.

The composition of resist making such chemical reaction is not limited to hydroxyl-groups of phenol compounds. Resist is not limited to novolac-based resist. Composition providing such chemical reaction may be added as the composition of resist.

A typical reaction of hydroxyl-groups of phenol compounds providing a volume expansion is esterification of hydroxyl-groups. Examples of esters are carboxylic acid ester, sulfonic acid ester, and thio-carboxylic acid ester. The volume of a resist increases when hydroxyl-groups of phenol compounds are esterified.

In the case of carboxylic acid ester, esterification of hydroxyl-groups is made by acylating hydroxyl-groups. As a reactant, acylation reagent can be used.

A reaction between a typical acylation reagent, acetyl chloride, and a resist base resin, cresol novolac, is represented by the following equation.

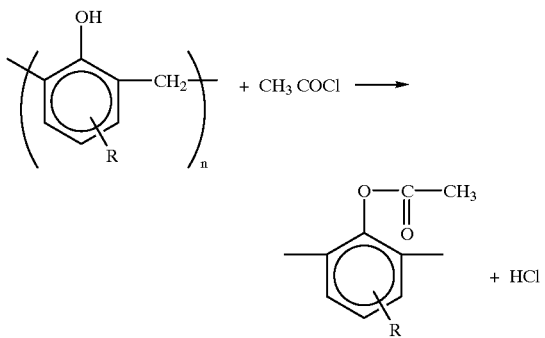

Embodiment

FIGS. 1A to 1D are cross sectional views explaining a method of forming a resist pattern according to an embodiment of the invention.

Figure 1A:
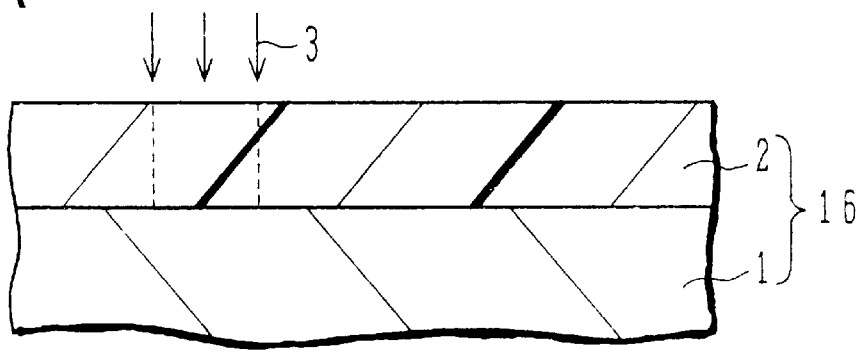
FIGS. 1A to 1D are cross sectional views briefly explaining a method of forming a resist pattern according to an embodiment of the invention.

As shown in FIG. 1A, a resist film 2 is formed on the surface of a substrate 1. A resist film 2 is made of novolac-based i-line resist (product name ZIR9000, Nippon Zeon Co., Ltd., Japan). This resist material can be developed by alkaline aqueous solution and has hydroxyl-groups of phenol compounds.

Figure 2:
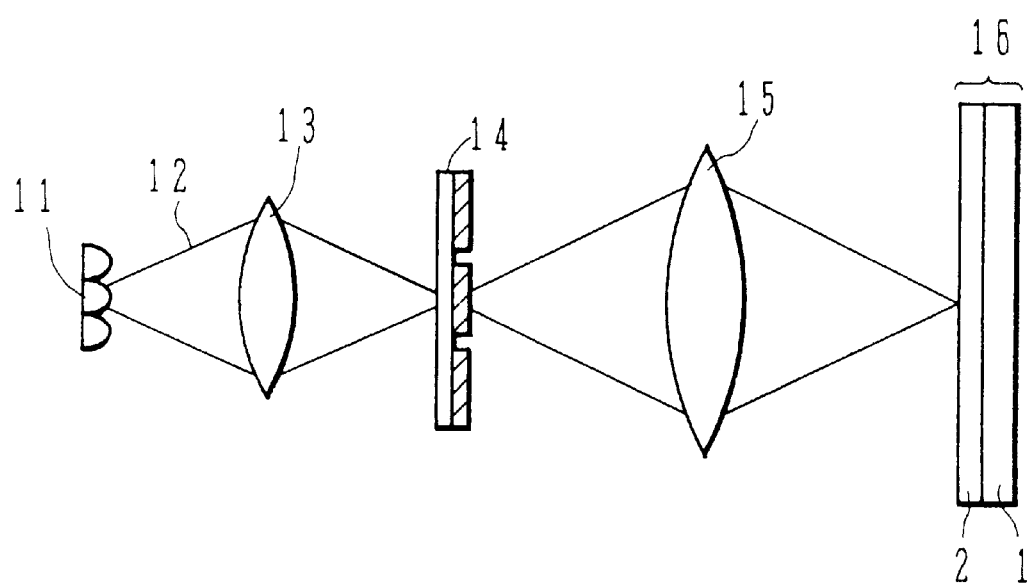
FIG. 2 is a schematic diagram showing the structure of an exposure system.

As shown in FIG. 1A, beams 3 are selectively applied to the resist film 2 by using an exposure system such as shown in FIG. 2, to expose the resist film 2. The beams 3 are, for example, i-line ultraviolet beams of a mercury lamp.

FIG. 2 shows a standard exposure system. Light beams 12 radiated from a light source 11 including a fly eye lens are converged by an illumination optical system 13 including an illuminating lens, and applied to a mask 14. Light shielding patterns are selectively formed on the surface of the mask 14. Light beams passed through the mask 14 are converged by a projection optical system 15 including a projecting lens and focused on the surface of a wafer 16 including a substrate 1 and a resist film 2.

A resolution of the exposure system is determined by the wavelength of light beams 12 radiated from the light source 11, an numerical aperture of the projection optical system 15, and other parameters. As a result, a latent image formed by light beams 3 as in FIG. 1A has a size larger than an ideal size.

Figure 1B:
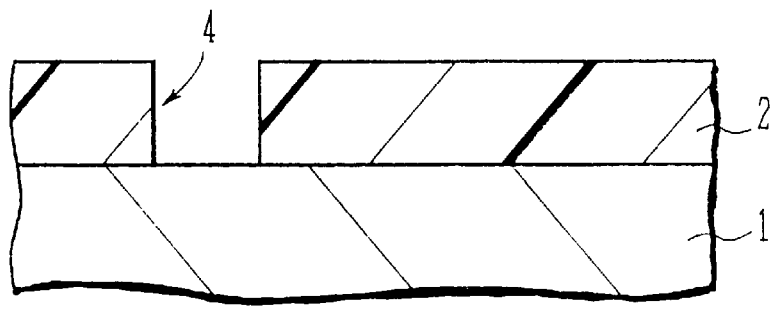

As shown in FIG. 1B, the exposed resist film 2 is developed by alkaline developing liquid, and the developed regions are removed to form openings 4. As described above, the minimum size of this opening 4 is limited by the resolution of the exposure system.

Figure 3:
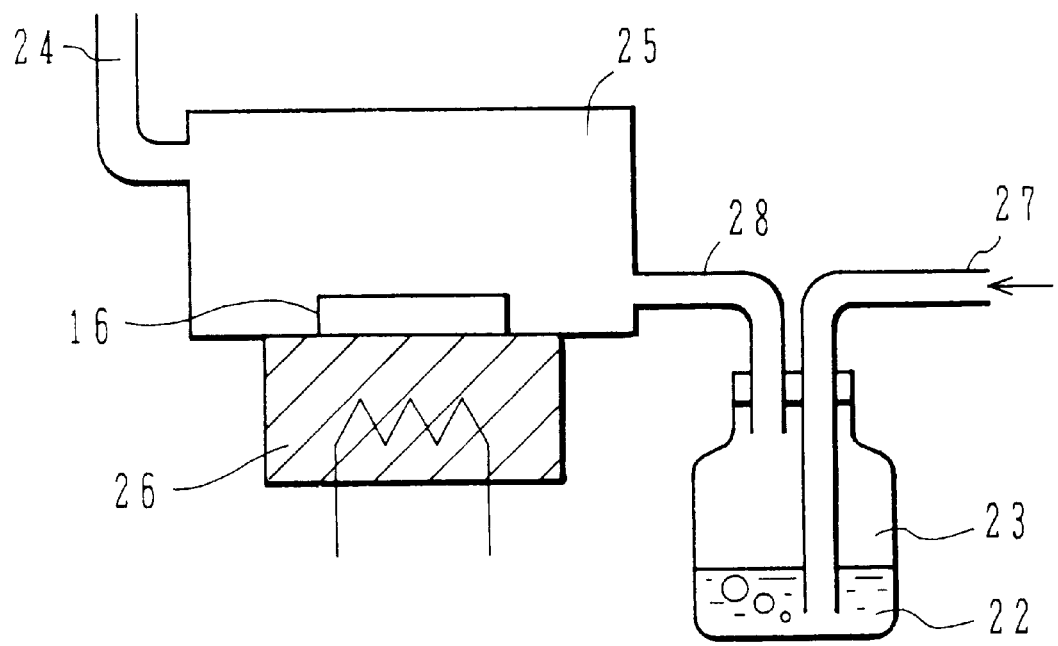
FIG. 3 is a schematic cross sectional view of a reaction system.

Next, the wafer 16 is placed in a reaction system such as shown in FIG. 3. The resist is reacted with acetyl chloride by flowing an acetyl chloride gas.

Referring to FIG. 3, acetyl chloride liquid 22 is accommodated in a bubbler vessel 23. Gas such as $N_2$ and air is supplied to a pipe 27 immersed in the acetyl chloride liquid 22. These gas bubbles in the acetyl chloride liquid 22 are supplied via a pipe 28 disposed at the upper space in the bubbler vessel 23 to a reaction chamber 25.

A wafer 16 is placed on a hot plate 26 in the reaction chamber 25. A reaction between the resist film on the wafer 16 and acetyl chloride progresses while the acetyl chloride gas flows and the wafer 16 is heated.

Gas used for the reaction is drained from a drain pipe 24. It is preferable to heat the wafer to about 90° C. or higher in order to efficiently progress the reaction between novolac-based resist and acetyl chloride.

The reaction between novolac-based resist and acetyl chloride represented by the above-described reaction equation increases the molecular weight and volume of the resist.

Figure 1C:
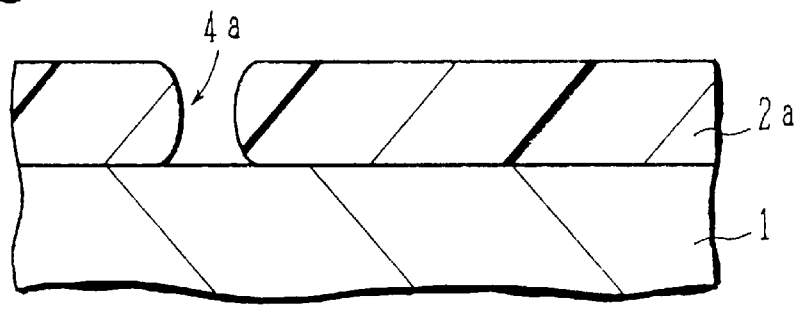

FIG. 1C shows a resist film 2a whose volume was increased by the reaction with acetyl chloride. The volume of the resist film 2a expands in omnidirections so that as shown in FIG. 1C, an opening 4a becomes narrower than the opening 4 shown in FIG. 1B.

The resist film 2a expands less in the lateral direction at the interface to the substrate 1 because a retaining force is applied to the resist film 2a from the substrate 1 in contact with the former.

However, the upper portion of the resist film 2a expands in the lateral direction because the opening 4a forms a free space, and the resist film at the opening takes a swollen or bulged shape at the middle thereof.

Figure 4A:
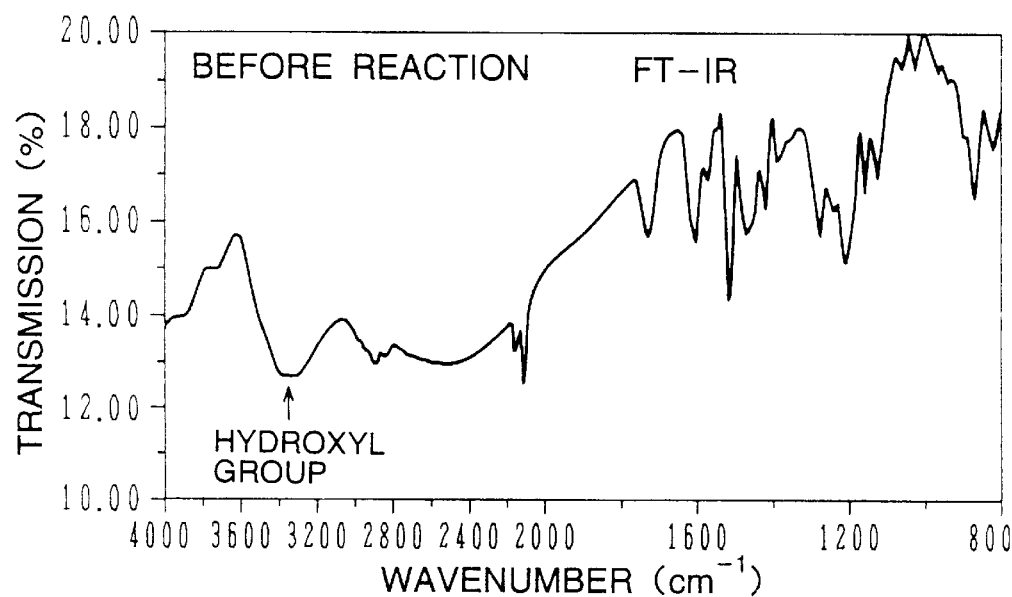
FIGS. 4A and 4B are graphs showing absorption spectra of a resist film before and after reaction.
Figure 4B:
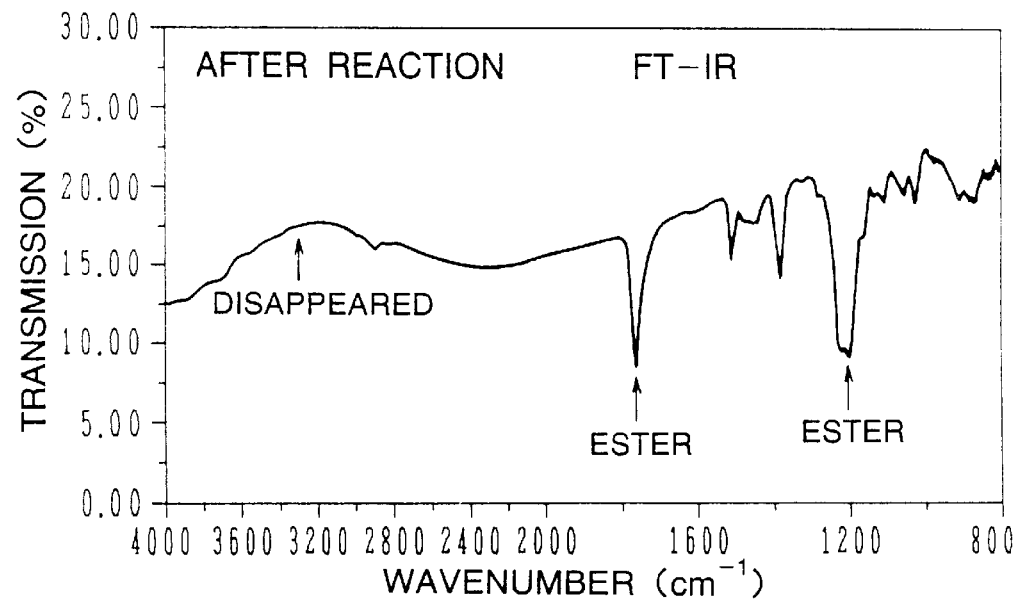

FIGS. 4A and 4B show Fourier spectroscopic infrared absorption spectra of a resist film before and after the reaction between novolac-based resist and acetyl chloride. FIG. 4A shows spectra before the reaction, and FIG. 4B shows spectra after the reaction. Measured samples were formed by a ZIR9100 resist film having a thickness of 1.12 μm formed on an Si wafer. The resist film was reacted with acetyl chloride.

Absorption of hydroxyl-groups at the wave number region of about 3000 to 3600 $cm^{-1}$ of the spectra before the reaction shown in FIG. 4A almost disappeared in the spectra after the reaction shown in FIG. 4B. It can therefore be hypothesized that the resist film has reacted almost entirely (through the whole thickness). Absorptions of esters at about 1200 $cm^{-1}$ and 1763 $cm^{-1}$ not present before the reaction clearly appeared in the spectra shown in FIG. 4B.

Figure 1D:
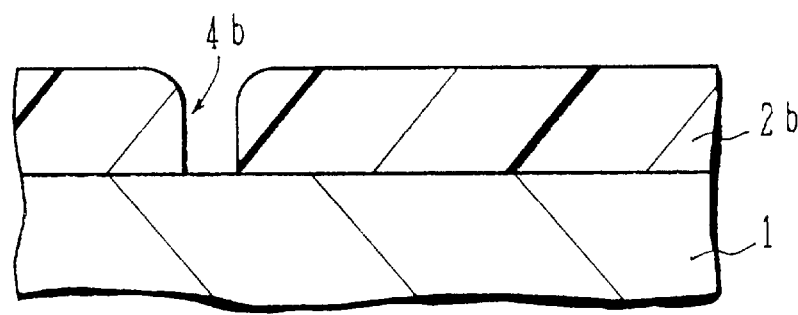

The resist film 2a after the reaction shown in FIG. 1C has a swollen shape at the middle of the opening 4a. In order to ensure high precision patterning, the resist pattern opening should have preferably vertical side walls. To this end, as shown in FIG. 1D, the resist film after the reaction was heated. For a reaction byproduct of novolac resin and acetyl chloride, the temperature is preferably raised to about 130° C. or higher.

This heat process increased a fluidity of the resist film 2a and formed generally vertical side walls of the opening as shown in FIG. 1D. Specifically, the resist film 2b expanded in the lateral direction also at the interface between the resist film 2b and the substrate 1. The effective size of the opening was further reduced.

As described above, after a novolac-based resist film is exposed and developed, it is reacted with acetyl chloride and subjected to a flow process. The opening 4b having a smaller size than the developed opening 4 was obtained. In this embodiment, the reaction process and the flow process are performed separately. The reaction and flow processes may be performed at the same time by raising the reaction temperature to about 130° C. or higher.

FIGS. 5A to 5F show a change in the shape of a resist pattern formed by the above-described embodiment. A resist pattern is broadly classified into an independent pattern such as a line of a line-and-space pattern and a through pattern such as a contact hole surrounded by a resist film.

Figure 5A:
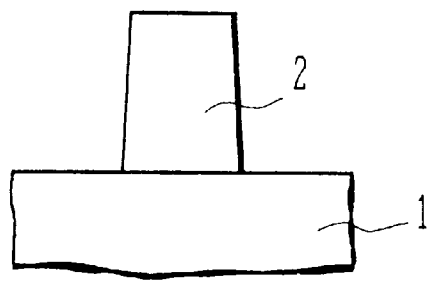
FIGS. 5A to 5F are schematic cross sectional views showing a change in a resist film by reaction.
Figure 5D:
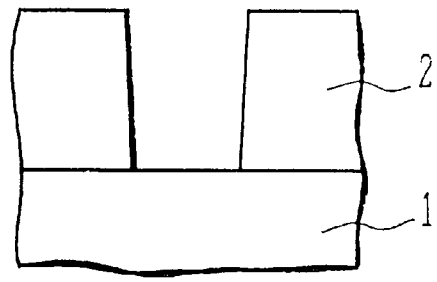

FIGS. 5A and 5D are schematic diagrams showing an independent pattern and a through (hole) pattern after the exposure and development. A pattern 2 of a resist film is coated on substrates 1 to form an independent pattern and a hole pattern.

Figure 5B:
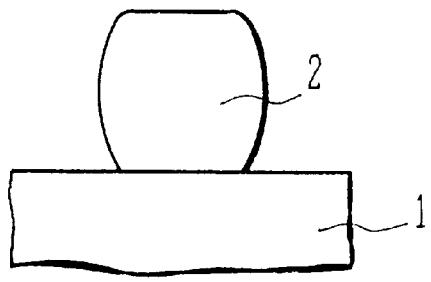
Figure 5E:
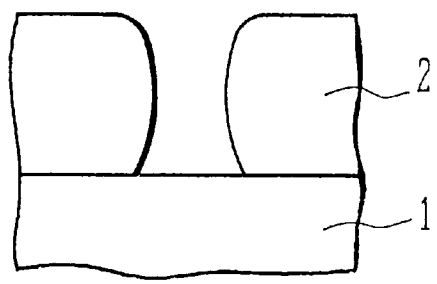

As these resist patterns are reacted with a certain composition (such as acetyl chloride), the pattern shapes change as shown in FIGS. 5B and 5E. Since a resistance at the contact surface of the substrate 1 is strong, lateral expansion of the resist film is restricted. Therefore, the resist patterns expand mainly at their upper portions in the lateral direction and in the vertical direction. The independent pattern in particular takes a swollen shape at the middle thereof as shown in FIG. 5B.

A through pattern of a small size is likely to have more or less slanted side walls of an opening as shown in FIG. 5D. The resist side walls at the bottom of an opening in particular are difficult to be vertical to the substrate. As a result, although the side walls after the reaction expand to take a swollen shape at the middle of the opening, this expansion is cancelled out by the slanted side walls before the reaction and relatively vertical side walls are likely to be formed as shown in FIG. 5E.

Figure 5C:
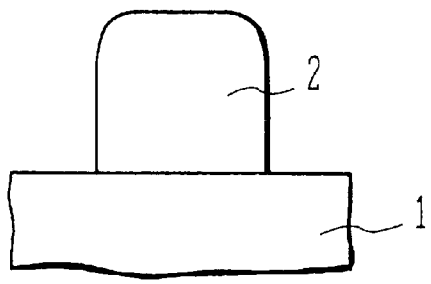
Figure 5F:
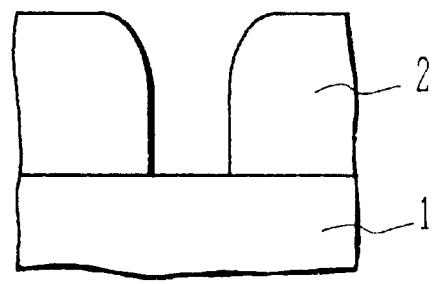

As the flow process is performed after the reaction by heating the resist films, the independent pattern and the through pattern change their shapes as shown in FIGS. 5C and 5F. Specifically, the resist film 2 of the independent pattern changes its swollen shape to generally a vertical side wall shape. The through pattern reduces the aperture size because the flow process pushes the side walls inward.

The size of the independent pattern is increased by the reaction and flow processes, whereas that of the through pattern is reduced. The above embodiment is particularly useful for forming a through pattern having a size smaller than a resolution of an optical system.

Experiment results using novolac-based i-line resist (product name ZIR9000, Nippon Zeon Co., Ltd., Japan) will be described.

Figure 6A:
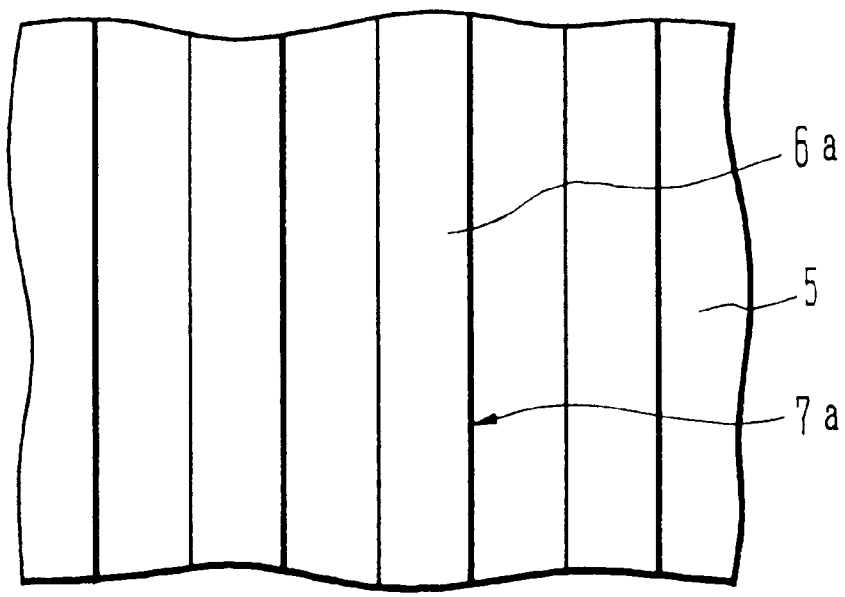
FIGS. 6A and 6B are plan views of experiment samples of resist patterns.
Figure 6B:
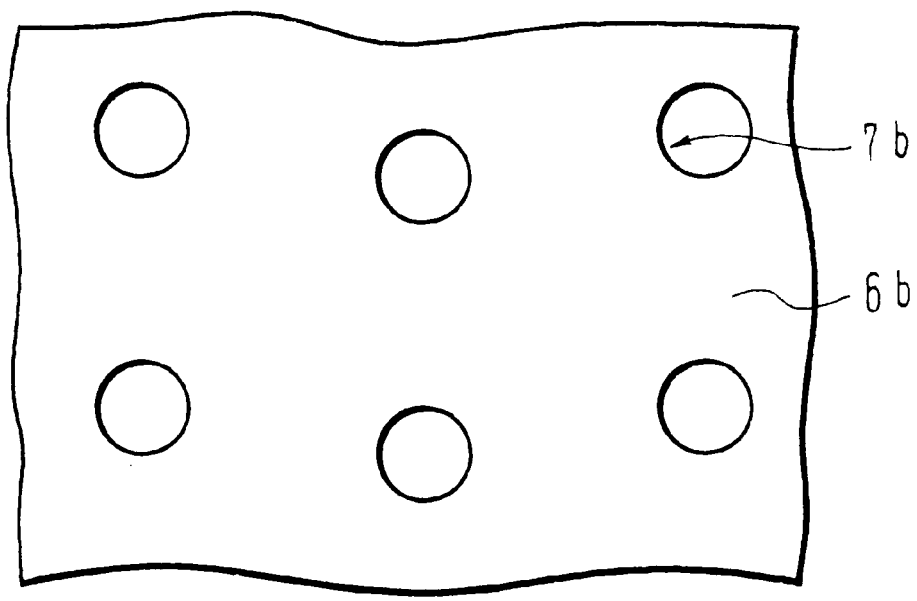

FIGS. 6A and 6B show pattern shapes of experiment samples. FIG. 6A shows a shape of a line-and-space pattern. A resist film was formed on an Si substrate 5 and exposed and developed to form a line pattern 6a. Openings (spaces) 7a are formed between a plurality of line patterns 6a. FIG. 6B shows a shape of a hole pattern. Circular openings (holes) 7b are formed in a resist film 6b.

The widths of the line pattern 6a and opening 7a of the line-and-space pattern were both set to 0.6 µm. The diameter of the circular opening 7b was set to 0.6 µm. After such resist patterns were formed, they were reacted with acetyl chloride under various conditions.

Figure 7A:
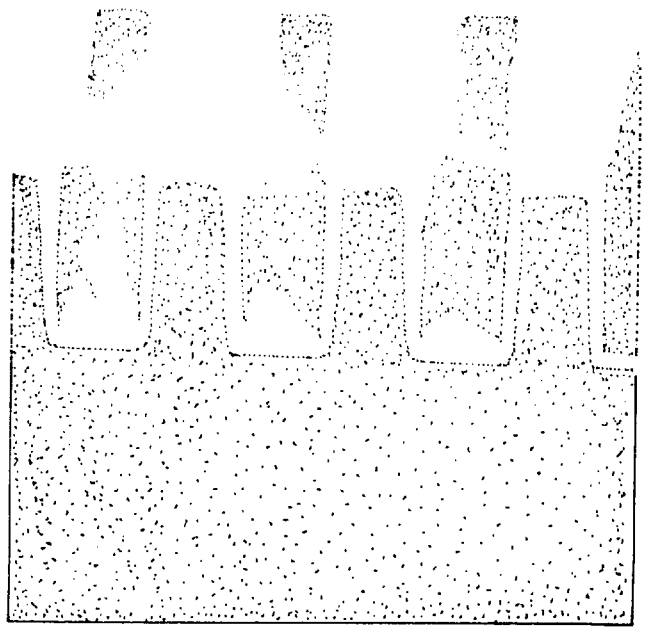
FIGS. 7A to 18B are microscopic photographs of thin films used by experiments.
Figure 7B:
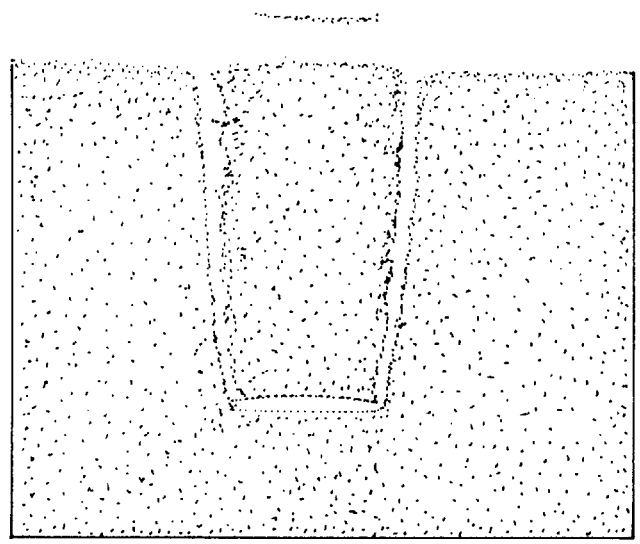

FIGS. 7A and 7B are photographs of the cross section of a resist pattern of Sample 1 exposed and developed. FIG. 7A is a photograph of a line-and-space pattern, the magnification being 21000. FIG. 7B is a photograph of the cross section of a hole pattern, the magnification being 41900.

Figure 8A:
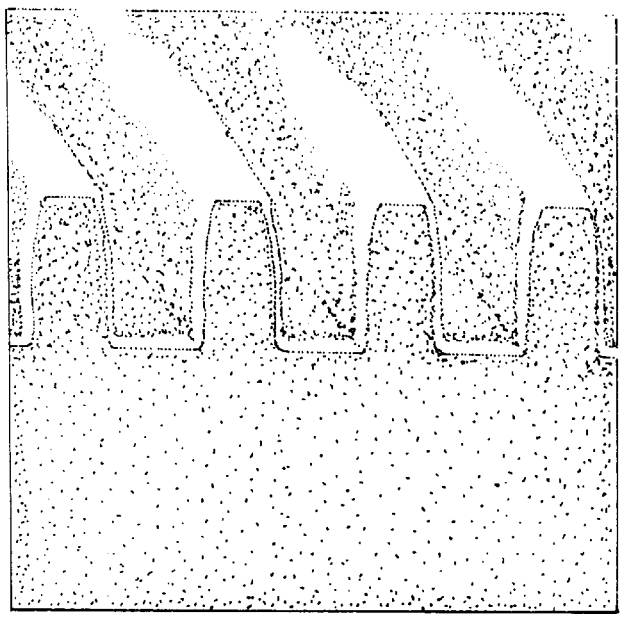
Figure 8B:
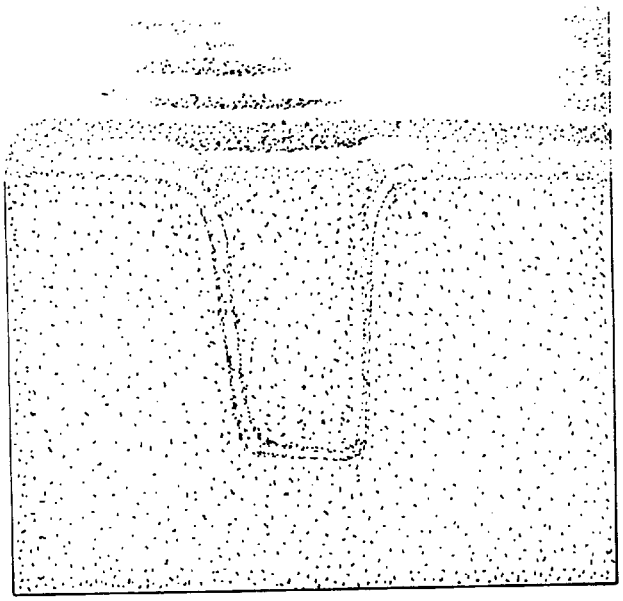

FIGS. 8A and 8B are photographs of the cross section of a resist pattern of Sample 2 heated to 150° C. for 2 hours in a nitrogen atmosphere after the development. FIG. 8A is a photograph of the cross section of a line-and-space pattern, the magnification being 19200.

FIG. 8B is a photograph of the cross section of a hole pattern, the magnification being 38300. Heating to 150° C. for 2 hours hardly changes the size of the resist pattern. The photographs of FIGS. 7A, 7B, 8A, and 8B are shown for the comparison with resist patterns reacted with acetyl chloride given in the following.

Figure 9A:
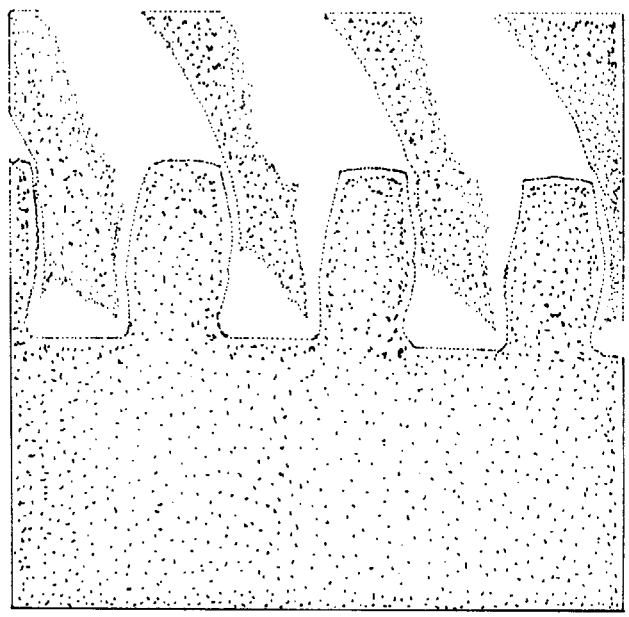
Figure 9B:
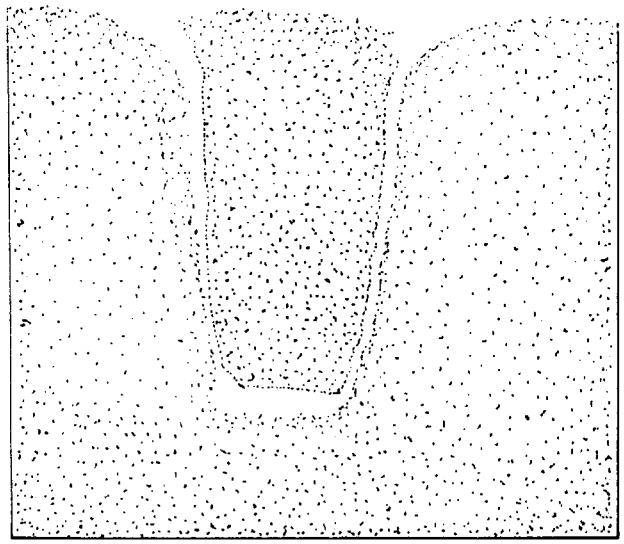

FIGS. 9A and 9B show resist patterns of Sample 3 reacted with acetyl chloride at 90° C. for 2 hours by using nitrogen as a carrier gas. FIG. 9A is a photograph of the cross section of a line-and-space pattern, the magnification being 21900. FIG. 9B is a photograph of the cross section of a hole pattern, the magnification being 43700.

The photograph of the line-and-space pattern of FIG. 9 clearly shows a barrel shape with a laterally swollen portion at the middle of the line pattern.

In contrast, although the hole pattern shown in FIG. 9B does not take a swollen shape at the middle thereof, it is seen that the hole was swollen in the lateral direction by volume expansion, more than the resist patterns not reacted with acetyl chloride shown in FIGS. 7B and 8B.

Figure 10A:
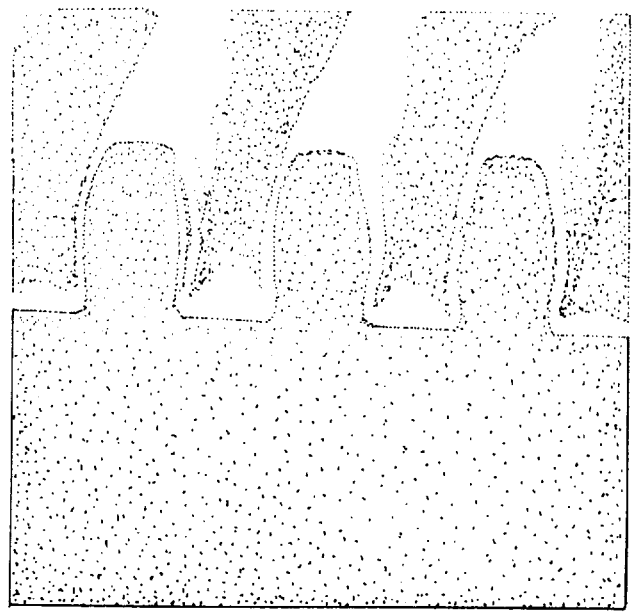
Figure 10B:
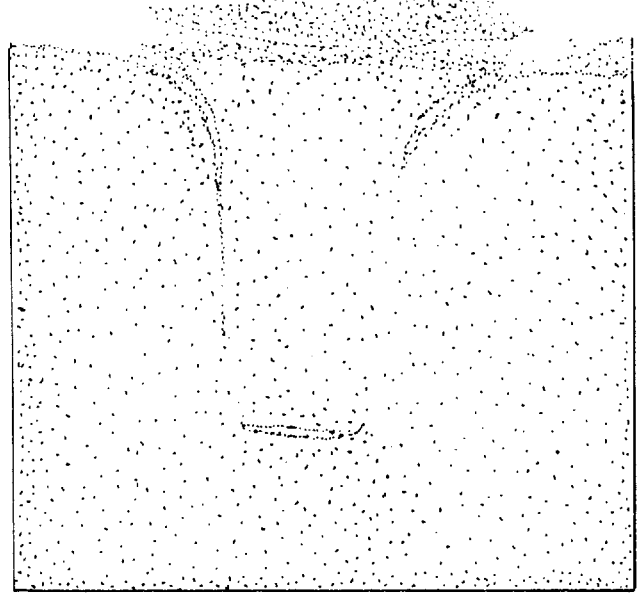

FIGS. 10A and 10B show resist patterns of Sample 4 reacted with acetyl chloride at 110° C. for 2 hours by using nitrogen as a carrier gas. FIG. 10A is a photograph of the cross section of a line-and-space pattern, the magnification being 21200. FIG. 10B is a photograph of the cross section of a hole pattern, the magnification being 42400. A similar change in the shape of the resist patterns to those shown in FIGS. 9A and 9B were observed.

Figure 11A:
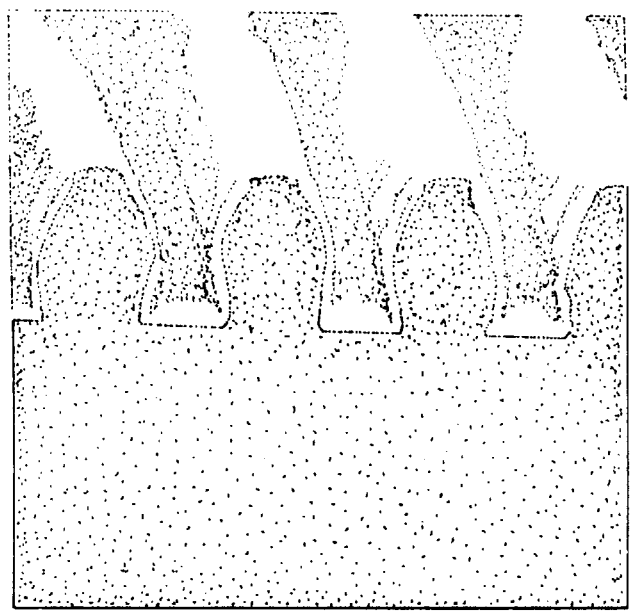
Figure 11B:
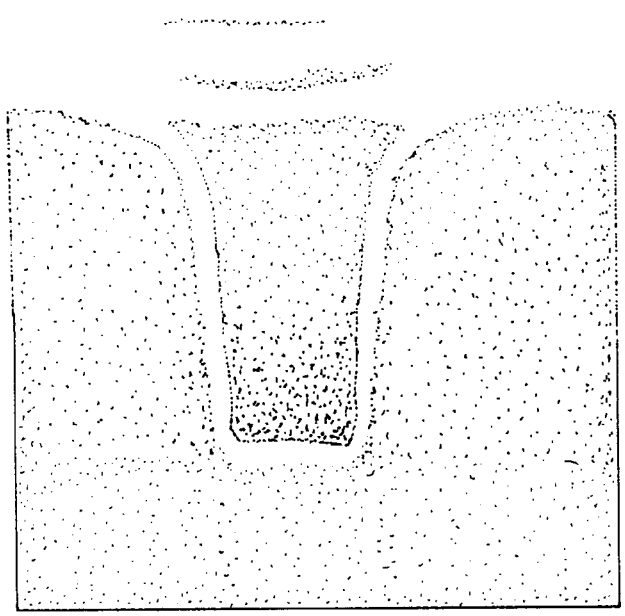

FIGS. 11A and 11B are photographs of resist patterns of Sample 5 reacted with acetyl chloride at 130° C. for 2 hours by using nitrogen as a carrier gas. FIG. 11A is a photograph of the cross section of a line-and-space pattern, the magnification being 20200. FIG. 11B is a photograph of the cross section of a hole pattern, the magnification being 40400.

The line shape of the line-and-space pattern shown in FIG. 11A takes a barrel shape with a further swollen portion. The cross section of the hole pattern shown in FIG. 11B has side walls more vertical and some swollen portion.

Figure 12:
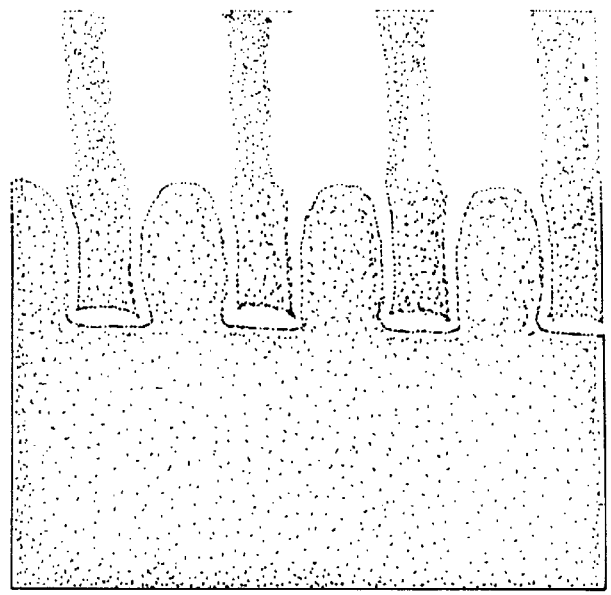
Figure 12:
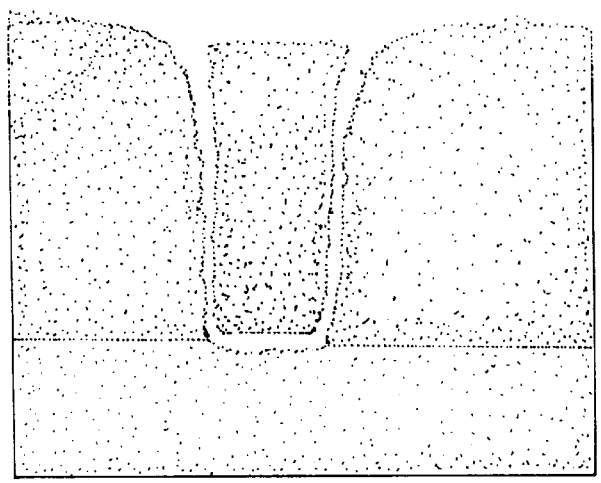

FIGS. 12A and 12B are photographs of resist patterns of Sample 6 reacted with acetyl chloride at 130° C. for 6 hours by using nitrogen as a carrier gas. FIG. 12A is a photograph of the cross section of a line-and-space pattern, the magnification being 19100. FIG. 12B is a photograph of the cross section of a hole pattern, the magnification being 38100.

These photographs indicate that the swollen portion at the middle of the line pattern and hole pattern was moderated. They also show a narrowed width of the space, a lateral expansion of resist, and a resist flow.

Figure 13A:
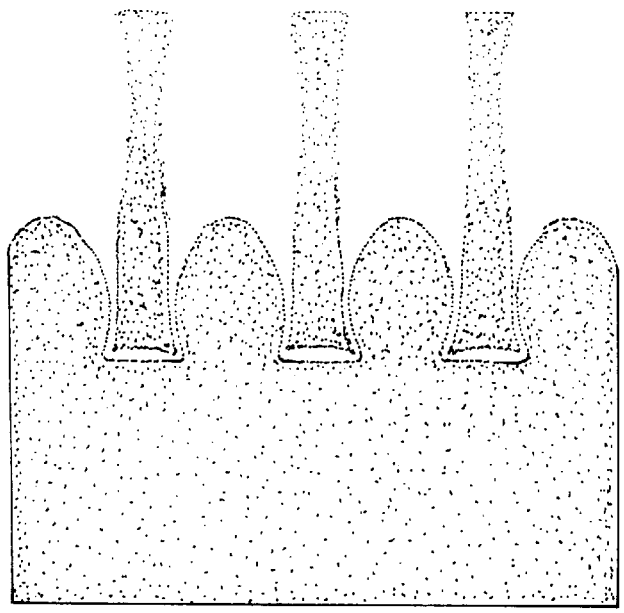
Figure 13B:
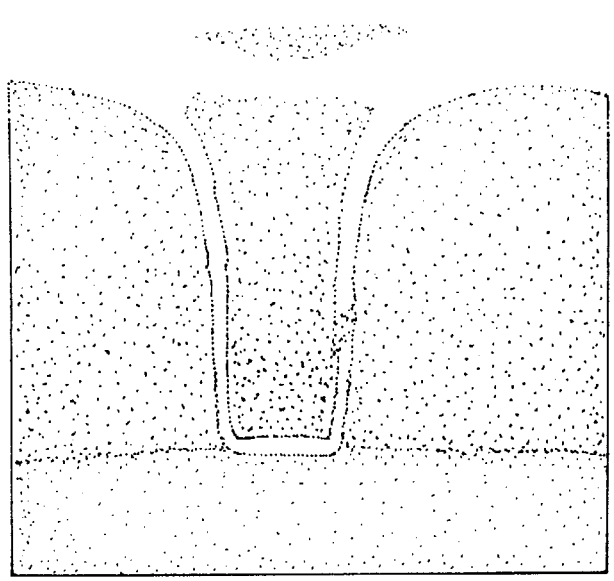

FIGS. 13A and 13B are photographs of resist patterns of Sample 7 reacted with acetyl chloride at 140° C. for 2 hours by using nitrogen as a carrier gas. FIG. 13A is a photograph of the cross section of a line-and-space pattern, the magnification being 20100. FIG. 13B is a photograph of the cross section of a hole pattern, the magnification being 40200.

A further expansion of the resist film and a barrel shape with a central swollen portion can be observed from the photograph of FIG. 13A. The effects of a resist flow are supposed to be weaker at 140° C. for 2 hours than at 130° C. for 6 hours. The hole pattern shown in FIG. 13B has side walls nearly vertical as in the case of FIG. 12, and the width of the opening is narrower.

Figure 14A:
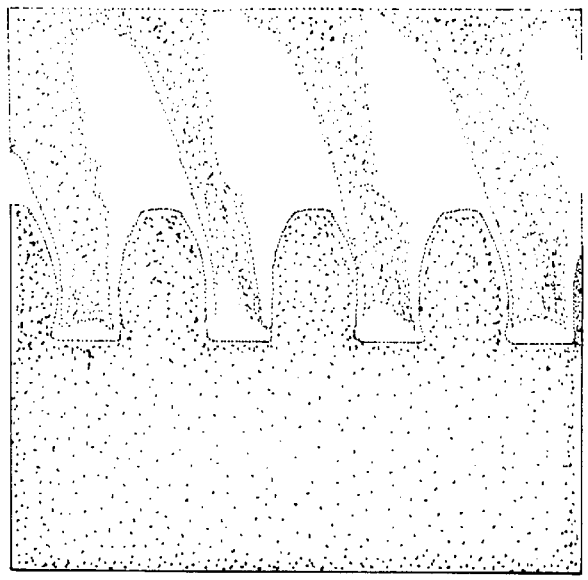
Figure 14B:
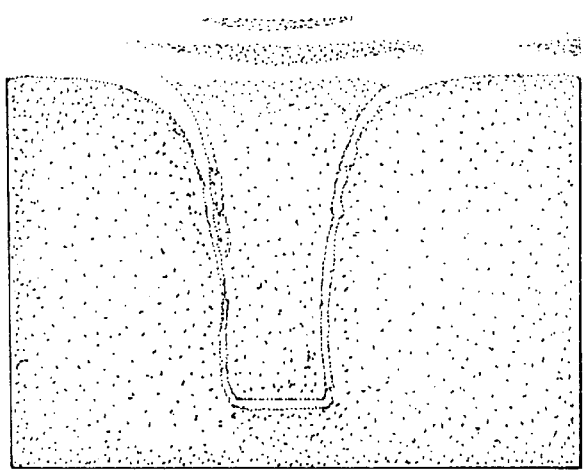

FIGS. 14A and 14B are photographs of resist patterns of Sample 8 reacted with acetyl chloride at 150° C. for 15 minutes by using nitrogen as a carrier gas. FIG. 14A is a photograph of the cross section of a line-and-space pattern, the magnification being 18500. FIG. 14B is a photograph of the cross section of a hole pattern, the magnification being 36900.

The cross section of the line pattern of FIG. 14A has side walls more vertical although some swollen portion is seen at the lower region. The effects of a resist flow are assumed to be intermediate between the case of 140° C. for 2 hours and the case of 130° C. for 6 hours. Although the cross section of the hole pattern of FIG. 14B is somewhat asymmetrical, the width of the hole is narrower.

Figure 15A:
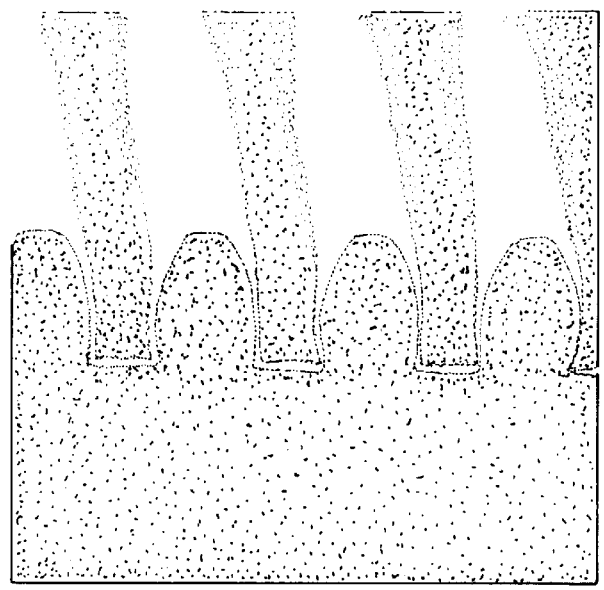
Figure 15B:
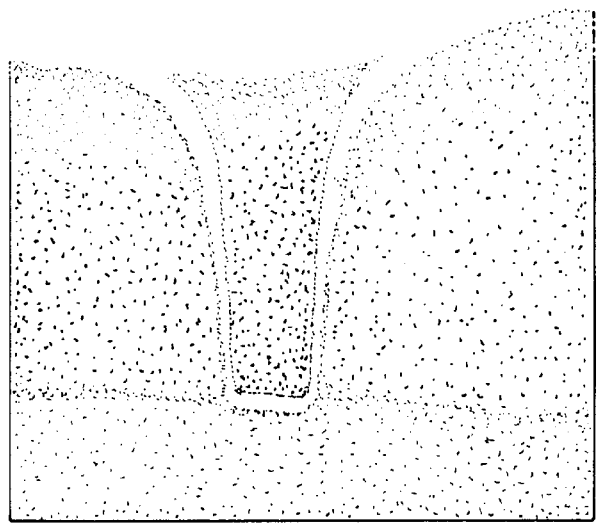

FIGS. 15A and 15B are photographs of resist patterns of Sample 9 reacted with acetyl chloride at 150° C. for a prolonged reaction period of 30 minutes by using nitrogen as a carrier gas.

Figure 16A:
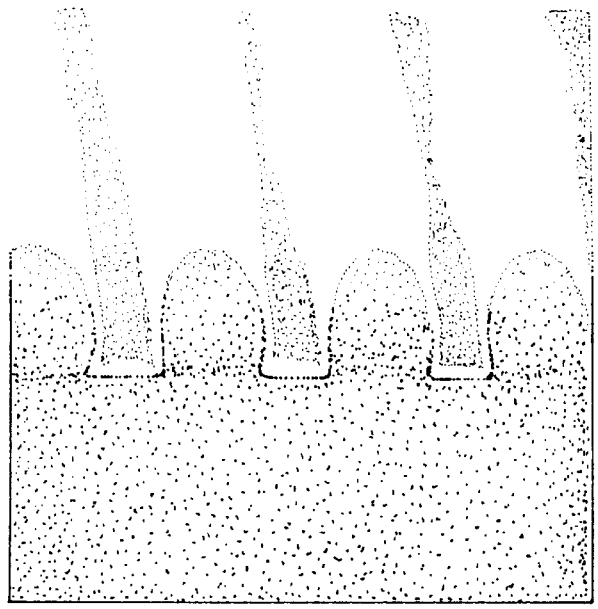
Figure 16B:
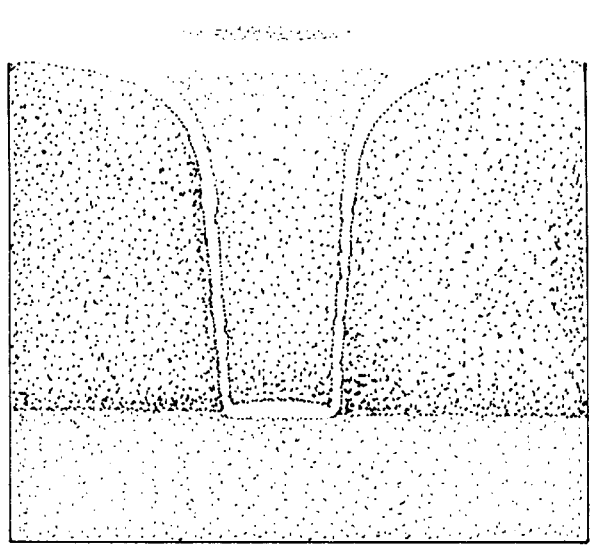

FIGS. 16A and 16B are photographs of resist patterns of Sample 10 reacted with acetyl chloride at 150° C. for a further prolonged reaction period of 1 hour.

Figure 17A:
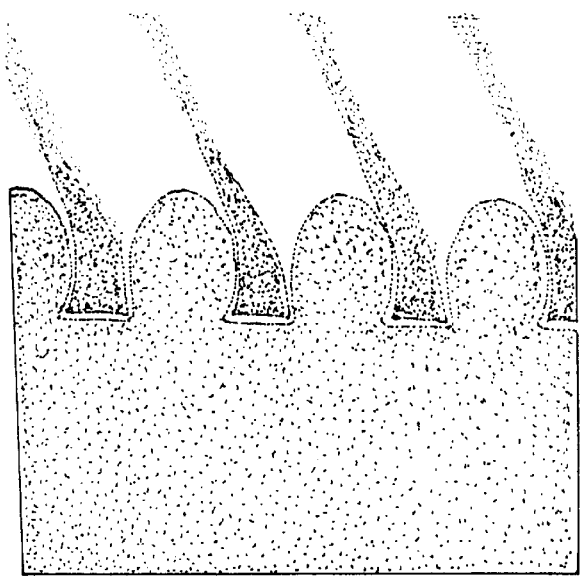
Figure 17B:
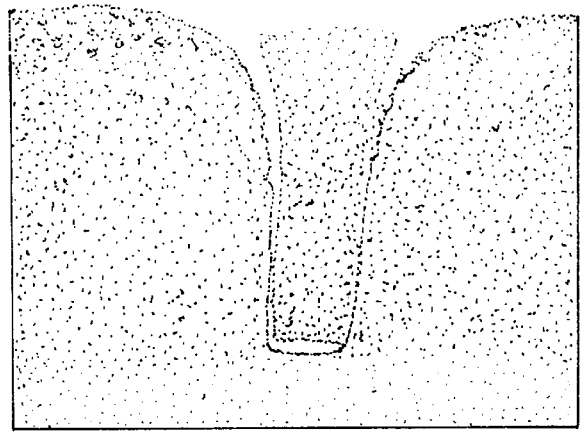

FIGS. 17A and 17B are photographs of resist patterns of Sample 10 reacted with acetyl chloride at 150° C. for still a further prolonged reaction period of 1.5 hour.

Figure 18A:
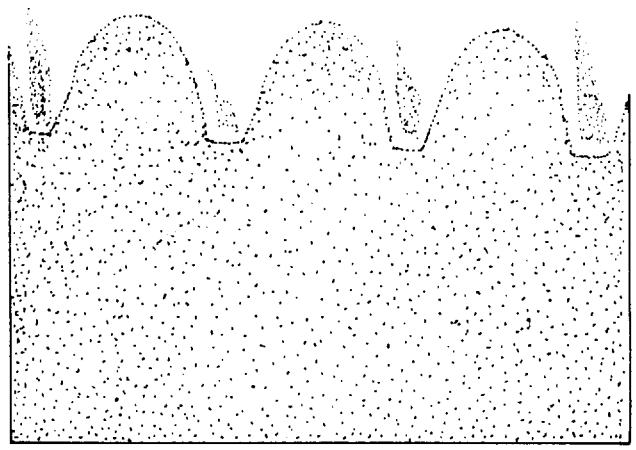
Figure 18B:
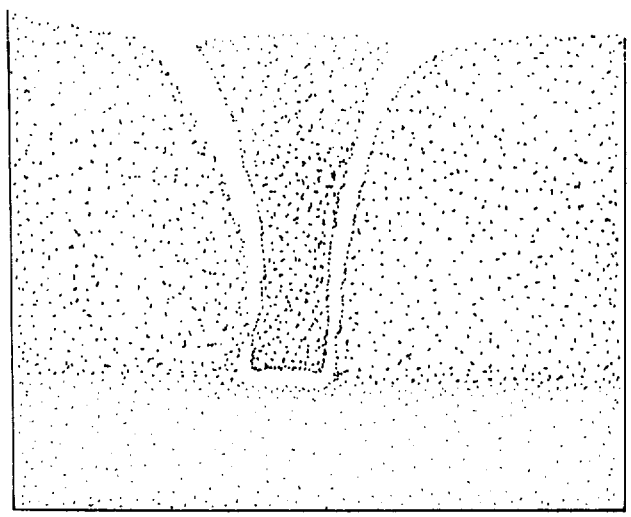

FIGS. 18A and 18B are photographs of resist patterns of Sample 10 reacted with acetyl chloride at 150° C. for a prolonged reaction period of 2 hours.

As seen from the photographs of FIGS. 15A and 15B to FIGS. 18A and 18B, as the reaction time at 150° C. is prolonged, a lateral expansion of a resist pattern gradually increases and the cross section changes from a central swollen shape to side walls generally vertical, forming a tapered side wall broadening the width toward the bottom. It was observed that the size of an opening gradually narrowed as the reaction time was prolonged.

The experiment results described above are summarized in Table 1. The measured thickness of resist films are also given in Table 1. The reduction effects of a hole size are represented by four steps including small (+), middle (++), large (+++), very large (++++), the details of which have been given in connection with the above explanation of the photographs.

TABLE 1

| No. | Process Condition | Temp. | Time | Film Thickness t (μm) | Hole Reduction Effect |
|---|---|---|---|---|---|
| 1 | Not Processed | — | — | 1.1 | |
| 2 | Only N$_2$ | 150 | 2h | 1.1 | |
| 3 | Acetyl Chloride + N$_2$ | 90 | 2h | 1.3 | + |
| 4 | " | 110 | 2h | 1.3 | + |
| 5 | " | 130 | 2h | 1.3 | + + |
| 6 | " | 130 | 6h | — | + + + |
| 7 | " | 140 | 2h | 1.3 | + + + |
| 8 | " | 140 | 15m | 1.3 | + + |
| 9 | " | 140 | 30m | 1.3 | + + |
| 10 | " | 140 | 1h | 1.3 | + + + (1st Embodiment) |
| 11 | " | 140 | 1.5h | 1.3 | + + + + |
| 12 | " | 140 | 2h | 1.3 | + + + + |

In Table 1, the leftmost column indicates a serial number of each sample, the process condition is a reaction process condition after the development, the temperature is a reaction process temperature, and the time is a reaction process time. The number of marks + represents the strength of the effect of reducing hole size.

As apparent from the above experiment results, as novolac-based resist is reacted with acetyl chloride, the volume of the resist film increases and the diameter of a hole pattern reduces. In the case of a line-and-space pattern, a line pattern becomes thick and a space width becomes broad.

In the above embodiment, novolac-based resist and acetyl chloride are reacted with each other at a temperature of 90° C. or higher. This temperature of 90° C. or higher is not necessarily limitative.

The central swollen shape of a resist pattern after the reaction is distinctive at a relatively low temperature. The central swollen shape is moderated gradually as the temperature is raised to 130° C. or higher. This can be hypothesized that resist is softened by heat and it flows also in the lateral direction (lateral flow).

If the side walls of an exposed and developed resist pattern are generally vertical, although the resist pattern after the reaction takes a central swollen shape, the central swollen shape can be changed to side walls more vertical because of lateral flow.

If the side walls of a developed resist pattern are slantwise, they can be made more vertical by the reaction with acetyl chloride. If the resist pattern is further heated, the opening of the resist pattern can be made more narrower. In order to obtain a resist flow, it is preferable to heat the resist to about 130° C. or higher.

Embodiment

FIGS. 19A to 19C and 20A to 20C illustrate a method of forming a resist pattern according to a more particular embodiment of the invention.

Figure 19A:
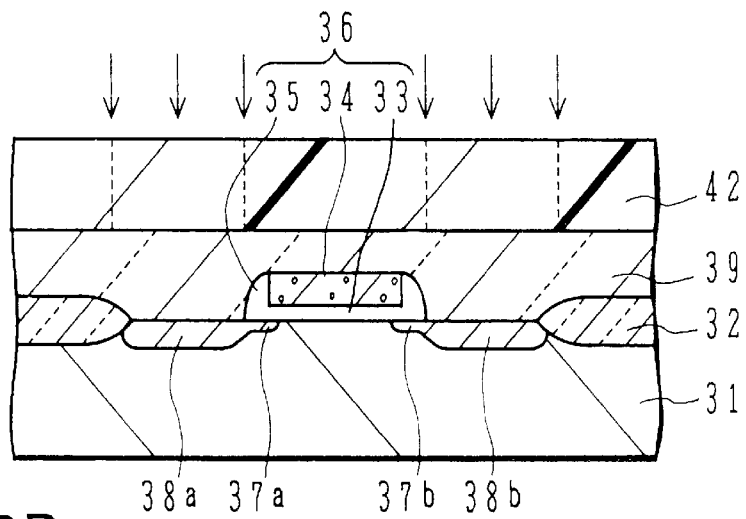
FIGS. 19A to 19C and 20A to 20C are schematic cross sectional views explaining a method of forming a resist pattern according to an embodiment of the invention.

As shown in FIG. 19A, a field oxide film 32 is selectively formed on the surface of a silicon substrate 31. At an active region surrounded by the field oxide film 32, an insulating gate structure is formed which has a gate insulating film 33 and a gate electrode 34. Thereafter, ions are doped to form lightly doped source/drain regions 37.

Side wall oxide regions 35 are formed on both sides of the insulating gate structure to complete an insulating gate electrode structure 36. By using the insulating gate electrode structure 36 as a mask, ions are doped to form heavily doped source/drain regions 38. Thereafter, a silicon oxide film 39 is formed on the wafer surface to insulate the gate electrode. A resist film 42 is formed on the silicon oxide film 39 and exposed to form openings for the contacts to the source/drain regions 38.

Figure 19B:
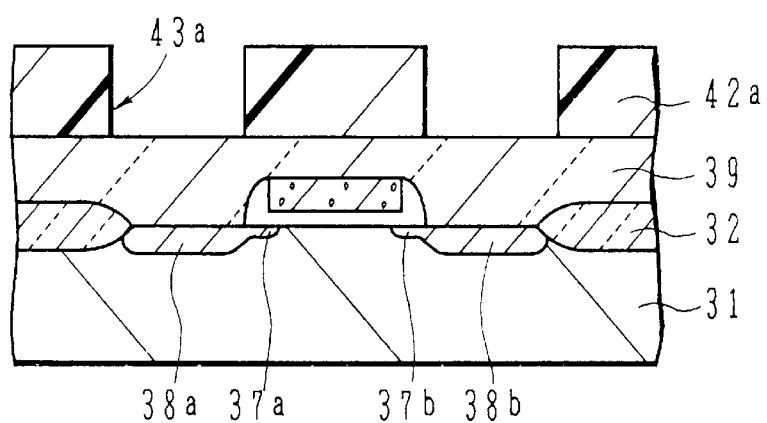

FIG. 19B shows the resist pattern after development. By developing and removing the developed regions, undeveloped regions 42a of the resist film 42 are left. In this manner, a hole pattern 43a is formed over the source/drain regions.

Figure 19C:
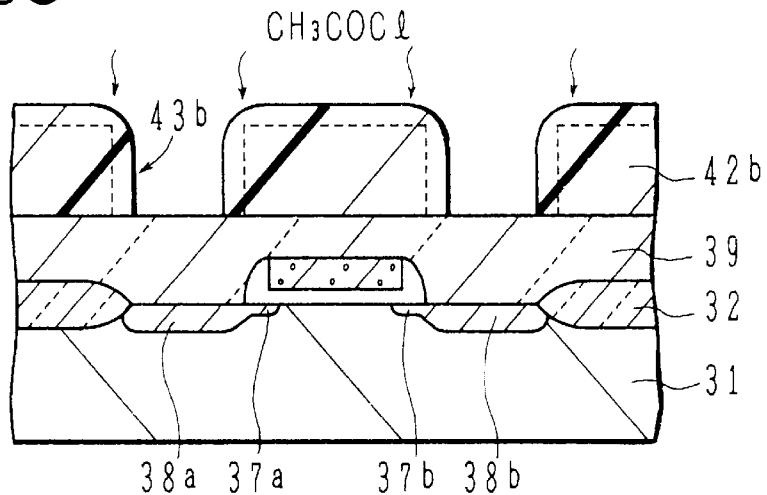

As shown in FIG. 19C, acetyl chloride gas is caused to flow on the resist film 42a having the hole pattern 43a to acylate hydroxyl-groups of the resist film. The resist film 42a acylated with acetyl chloride expands, changing its shape to become a resist film 42b. The size of the opening pattern 43b of the resist film becomes smaller than the opening pattern 43a after the development.

By using the expanded resist mask 42b as an etching mask, the underlying silicon oxide film 39 is patterned.

Figure 20A:
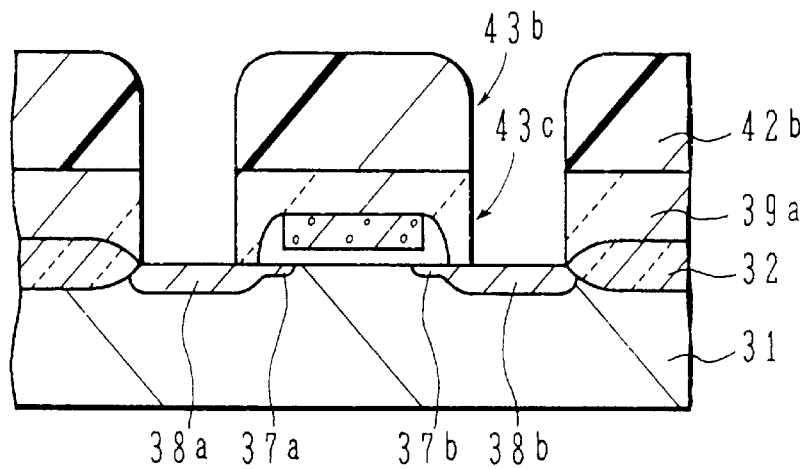

FIG. 20A illustrates a process of forming openings 43c by anisotropically etching the underlying silicon oxide film 39 by using the resist mask 42b as the etching mask. The silicon oxide film 39a is etched in conformity with the reduced size of the openings 43b of the resist pattern 42b having an increased volume. After the etching, the residual resist mask 42b is removed.

Figure 20B:
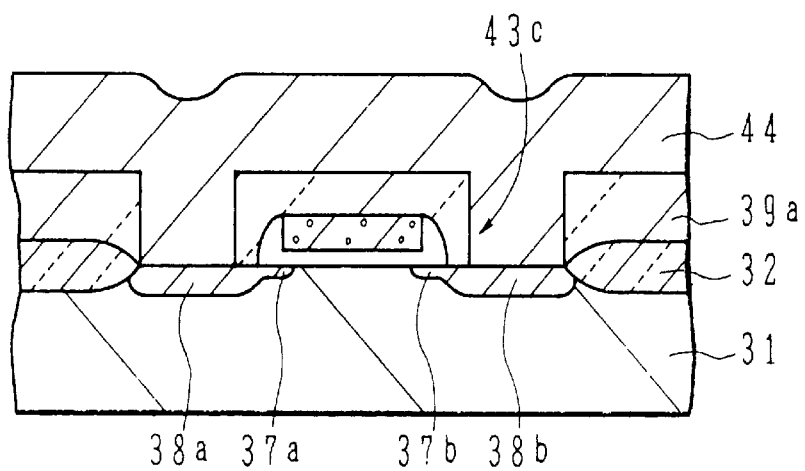

As shown in FIG. 20B, an electrode layer 44 such as polycrystalline silicon, refractory metal, and aluminum is deposited on the surface of the wafer with the openings 43c. The electrode layer 44 omhic-contacts the source/drain regions 38a and 38b. Thereafter, a resist pattern is formed on the electrode layer 44 to pattern the electrode layer 44.

Figure 20C:
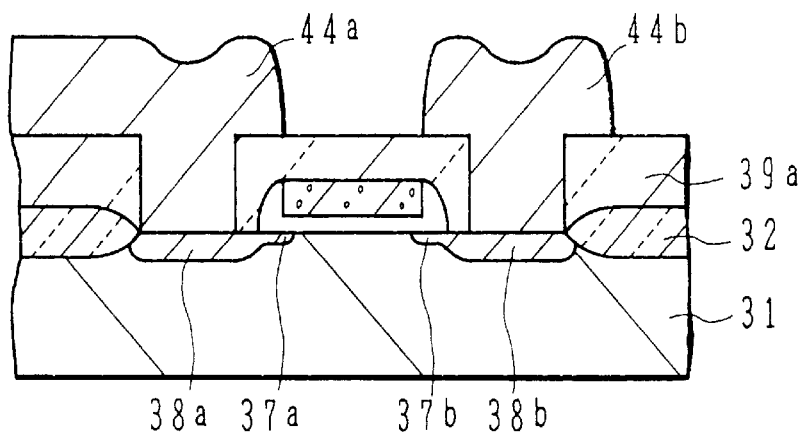

FIG. 20C shows a patterned electrode layer. By removing unnecessary regions of the electrode layer 44, an electrode 44a connected to the source/drain region 38a and an electrode connected to the source/drain region 38b can be obtained.

Figure 21:
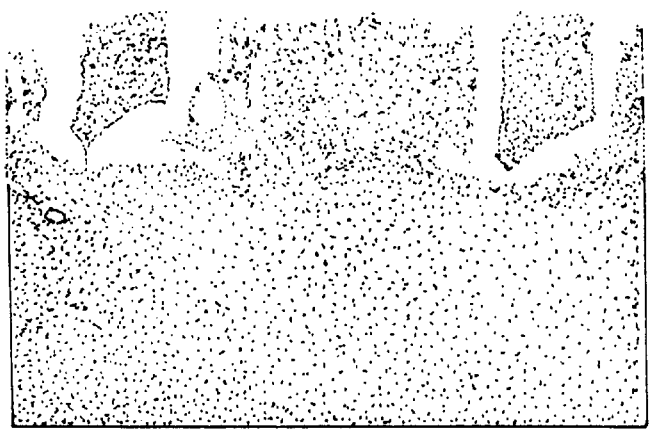
FIGS. 21 to 27 are microscopic photographs of thin films used by experiments.

Samples were formed by the embodiment method and measured. Resist films were made of novolac-based resist. After a resist film was formed, the sample was pre-baked, exposed, and developed to obtain a resist pattern. An example of a resist pattern at this stage is shown in FIG. 21.

The resist pattern was made in contact with acetyl chloride gas at 90° C. for 30 minutes by using nitrogen as a carrier gas. After this reaction, the resist pattern was subjected to a heat treatment for 2 hours at 170° C.

Figure 22:

An example of the cross section of the resist pattern at this stage is shown in FIG. 22. A reduced diameter of each hole can be clearly observed.

If ultraviolet rays are applied to the resist film, a liquidity of the resist film can be enhanced.

Embodiment

Ultraviolet rays from an ultraviolet lamp were applied to the whole surface of a resist pattern formed by the above embodiment method. Thereafter, the resist pattern was made in contact with acetyl chloride gas at 90° C. or about 30 minutes by using nitrogen as a carrier gas. After this reaction, the resist pattern was subjected to a heat treatment at 150 to 170° C.

Figure 23:
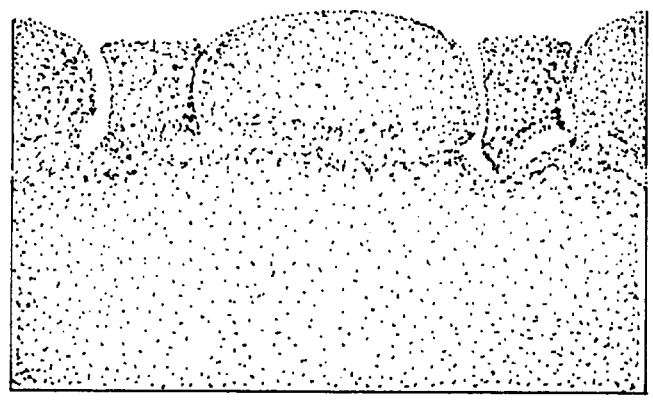

An example of a resist pattern subjected to a heat treatment at 150° C. for 2 hours is shown in FIG. 23. A reduced diameter of a hole can be clearly observed.

Figure 24:
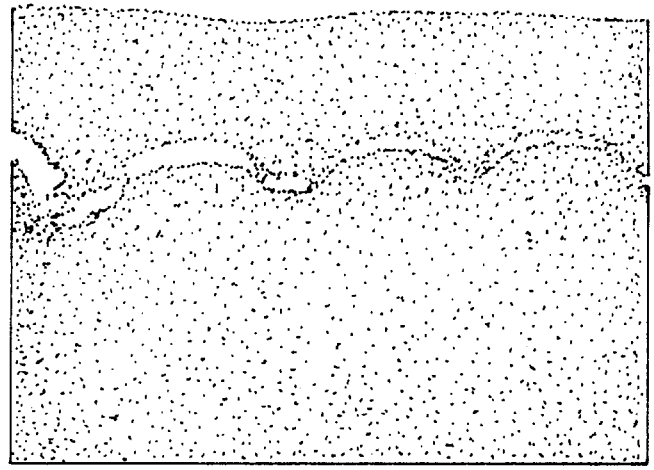

A resist pattern subjected to a heat treatment at 170° C. for about 30 minutes changed the size of a hole as shown in FIG. 24. Since the resist fluidity became excessive, the hole was fully buried.

From the above experiment results, it can be seen that resist becomes likely to flow if ultraviolet rays are applied to the resist pattern.

Comparative Examples

Figure 25:
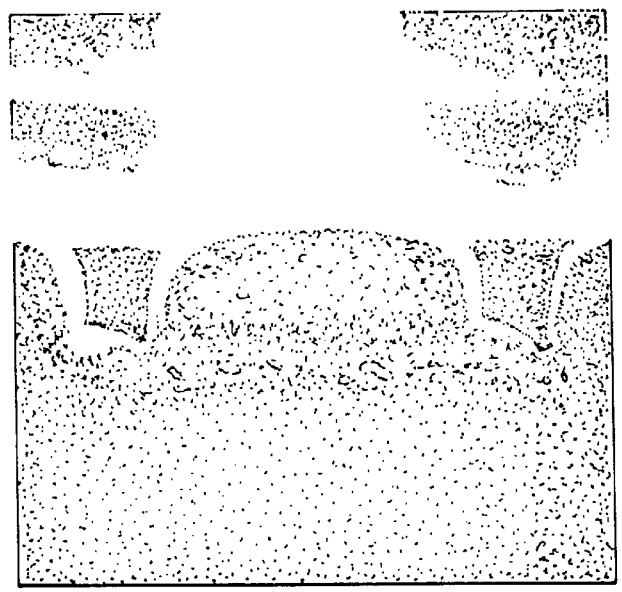

Ultraviolet rays from an ultraviolet lamp were applied to the whole surface of a resist pattern formed by the above embodiment method, and subjected to a heat treatment at 170° C. for about 30 minutes without an acylation process. An example of a resist pattern at this stage is shown in FIG. 25. It can be seen that although the diameter of a hole is reduced, the thickness of the resist film is greatly reduced.

Although esterification by acetyl chloride has been described, other esterification reactions may also be used. For example, sulfonic acid esterification may be used.

As an ultraviolet light source, a mercury lamp may be used.

The resist mask shown in FIG. 21 was reacted with acetyl chloride gas at 150° C. for about 2 hours by using nitrogen as a carrier gas. For comparison sake, wafers not applied with ultraviolet rays were heated and reacted.

Figure 26:
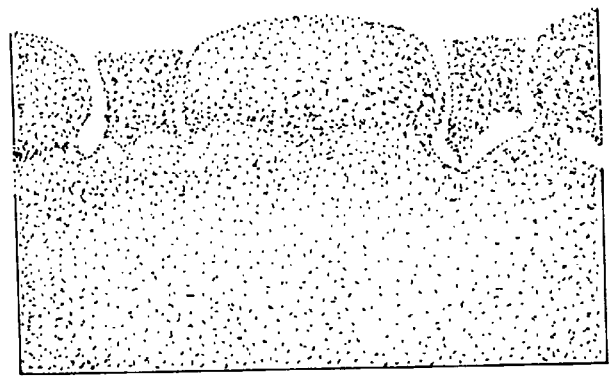

FIG. 26 is a photograph of the cross section of a resist pattern which was applied with ultraviolet rays over the whole surface thereof and reacted with acetyl chloride by using nitrogen as a carrier gas. It can be observed that a hole is likely to be reduced in size if ultraviolet rays are applied to the resist film. In the embodiment, the acetyl chloride process is performed after ultraviolet rays are applied. Similar effects can be obtained even if the acetyl chloride process is performed while ultraviolet rays are applied.

Figure 27:
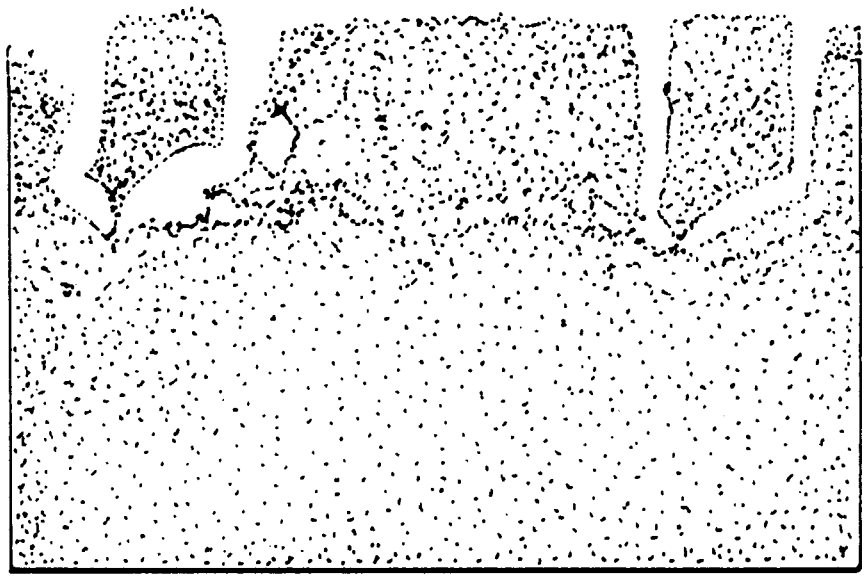

FIG. 27 is a photograph of the cross section of a resist pattern without exposure of ultraviolet rays.

Novolac-based resist samples after exposure were made in contact with acetyl chloride gas by using nitrogen as a carrier gas, at 180° C. for 2, 5, 10, 20, and 60 minutes, and absorption spectra of the samples were measured.

Figure 28:
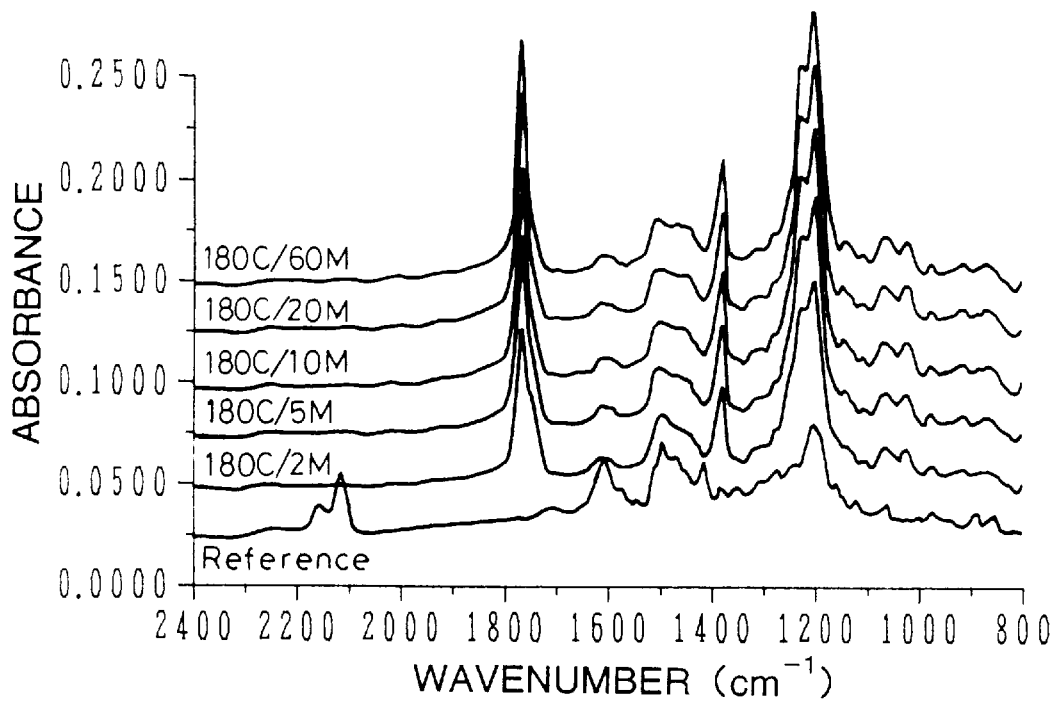
FIG. 28 is a graph showing infrared absorption spectra of experiments samples.

FIG. 28 shows the measurement results.

Figure 29:
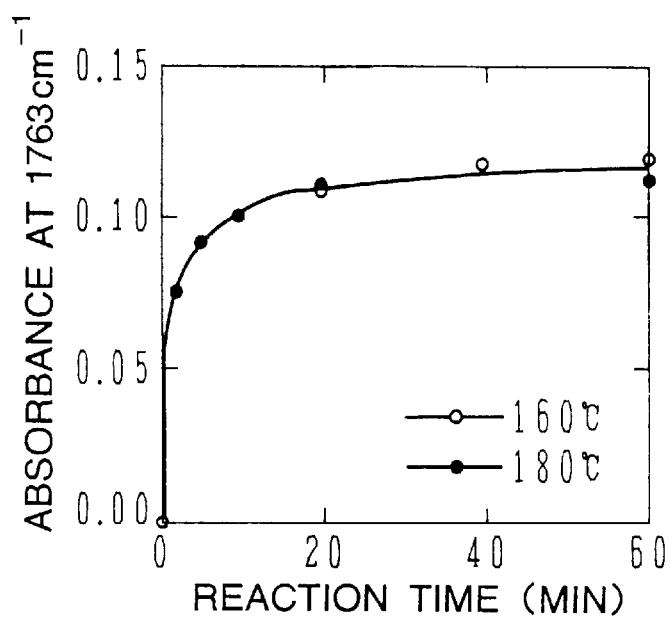
FIG. 29 is a graph showing a change in an absorption intensity with reaction time.

An absorption at 1763 cm$^{-1}$ is the absorption by a byproduct of reaction between novolac resin in each resist sample and acetyl chloride. A relationship between an absorption peak intensity and a reaction time is shown in FIG. 29. It is seen that absorption almost saturates in about 15 minutes and the reaction almost terminates in about 15 minutes.

Embodiment

Similar to the above-described embodiment, a photoresist mask is formed, exposed, and developed to form a resist pattern.

Figure 30A:
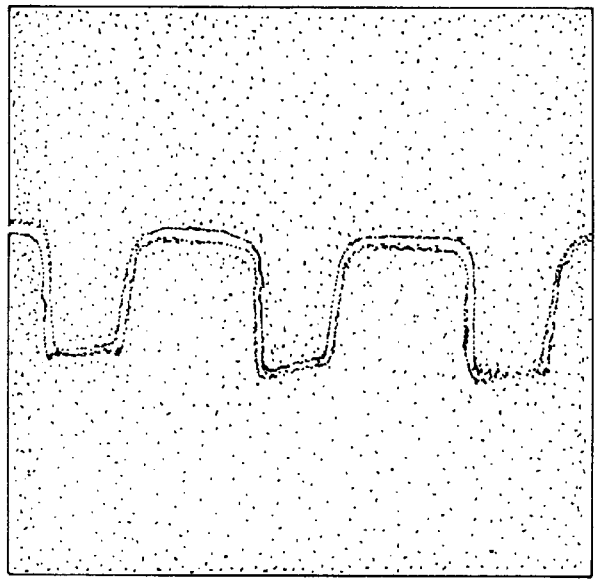
FIGS. 30A to 33 are microscopic photographs of thin films used by experiments.
Figure 30B:
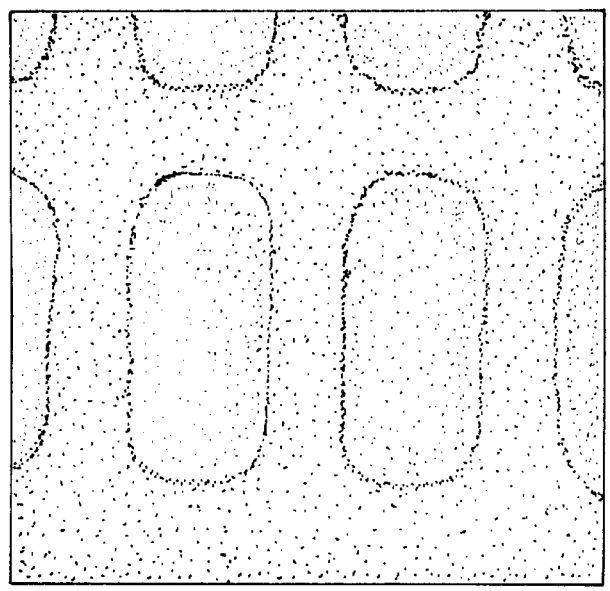

FIGS. 30A and 30B show a resist pattern formed in the above manner. FIG. 30A is a cross sectional view of the resist pattern, and FIG. 30B is a plan view thereof.

Figure 31A:
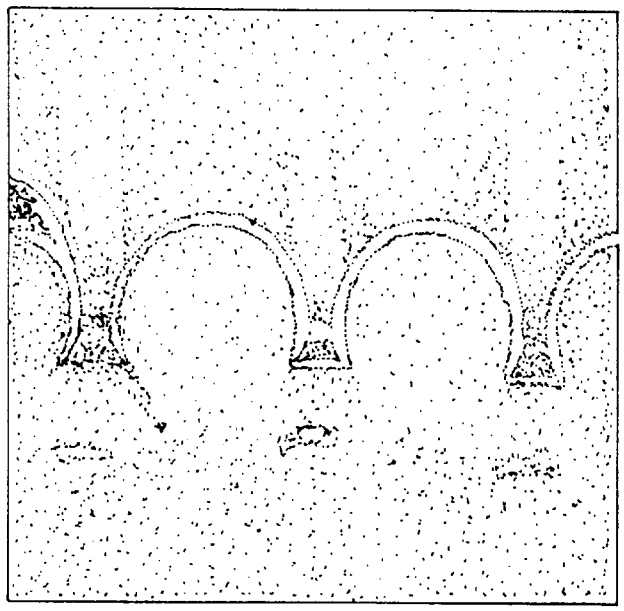
Figure 31B:
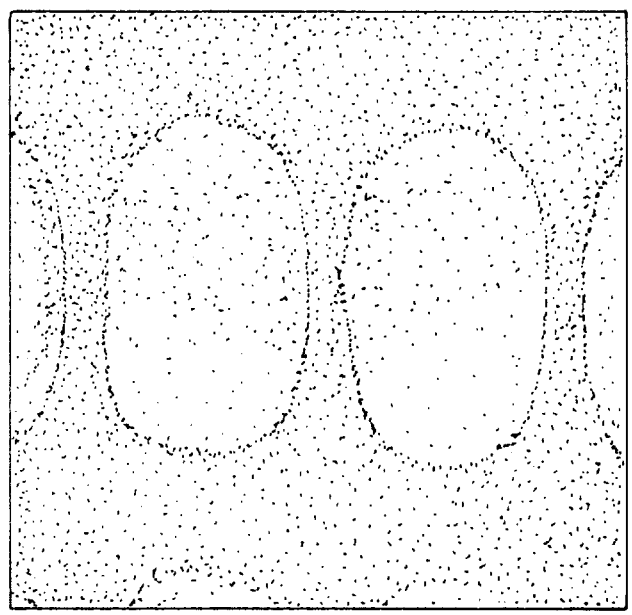

This resist pattern was reacted with acetyl chloride gas at 150° C. for 15 minutes by using nitrogen as a carrier gas. An example of the reacted resist pattern is shown in FIGS. 31A and 31B. FIG. 31A is a cross sectional view of the resist pattern, and FIG. 31B is a plan view thereof.

Figure 32A:
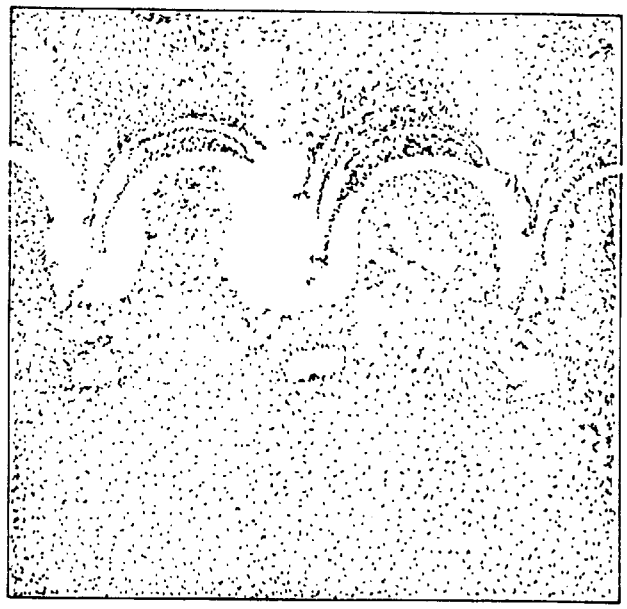
Figure 32B:
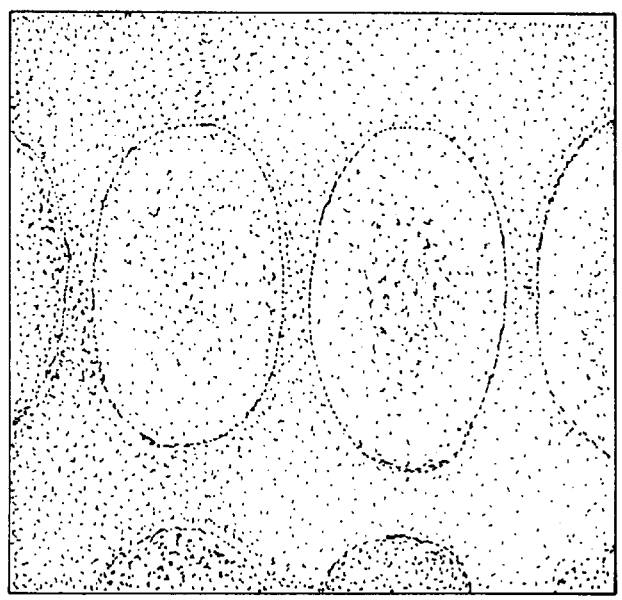

Another resist pattern was reacted with acetyl chloride gas at 150° C. for 30 minutes by using nitrogen as a carrier gas. The resist pattern after reaction is shown in FIGS. 32A and 32B.

Figure 33:
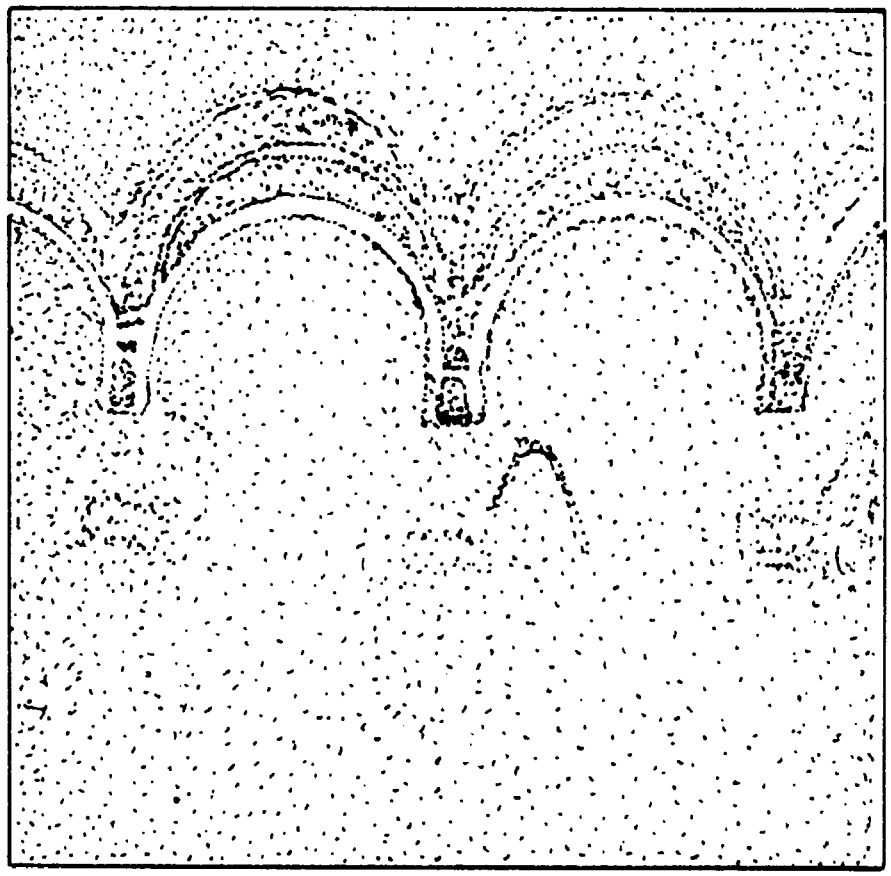

Also, another resist pattern was reacted with acetyl chloride gas at 150° C. for 15 minutes. After the gas was stopped, it was heated to 170° C. for 15 minutes in the air. An example of this resist pattern after the heat treatment is shown in FIG. 33.

With the reaction at 150° C. for 15 minutes, the resist pattern expanded and took a central swollen shape.

With the reaction at 150° C. for 30 minutes, the resist pattern expanded at its bottom and formed side walls depending downward generally vertically.

A similar shape was obtained in the case of the reaction at 150° C. for 15 minutes followed by the heat treatment at 170° C. for 15 minutes.

Although novolac-based resist is used as a resist material in the above embodiment, the resist material is not limited only to novolac-based resist.

Embodiment

A resist film was formed by using a resist material which is resin made of polyvinyl phenol reacted with acetal and mixed with photo-activated acid generator. The exposed and developed resist pattern was reacted with acetyl chloride and subjected to a heat treatment.

The volume of the resist pattern increased 0 to 20%. A reduced diameter of a hole and an enlarged line pattern of a line-and-space pattern were also observed.

The resist material of resin made of polyvinyl phenol reacted with acetal and mixed with photo-activated acid generator is represented by the following chemical equation.

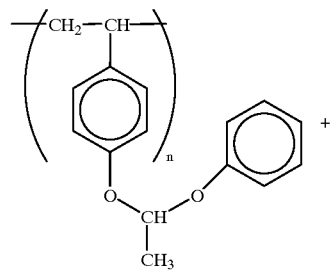

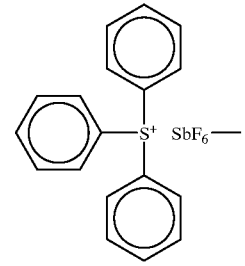

Embodiment

A resist film was formed by using a resist material which uses t-BOCed (tert-butyloxycarbonyloxy) resin as polyvinyl phenol and is mixed with photo-activated acid generator. The exposed and developed resist pattern was reacted with acetyl chloride and subjected to a heat treatment. The volume of the resist pattern increased 2 to 3%. This resist material is represented by the following equation.

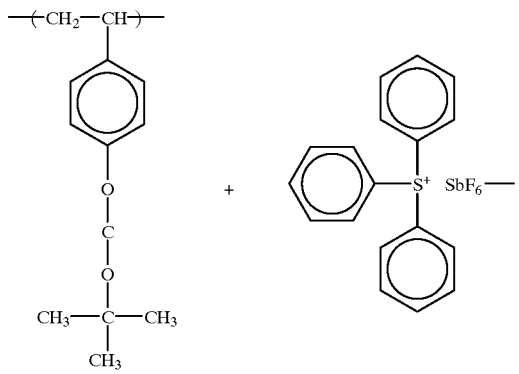

In the above description, although a resist film is heated and reacted with a reactant, the reaction type is not limited thereto. For example, a chemical reaction may be progressed by plasma.

Figure 34:
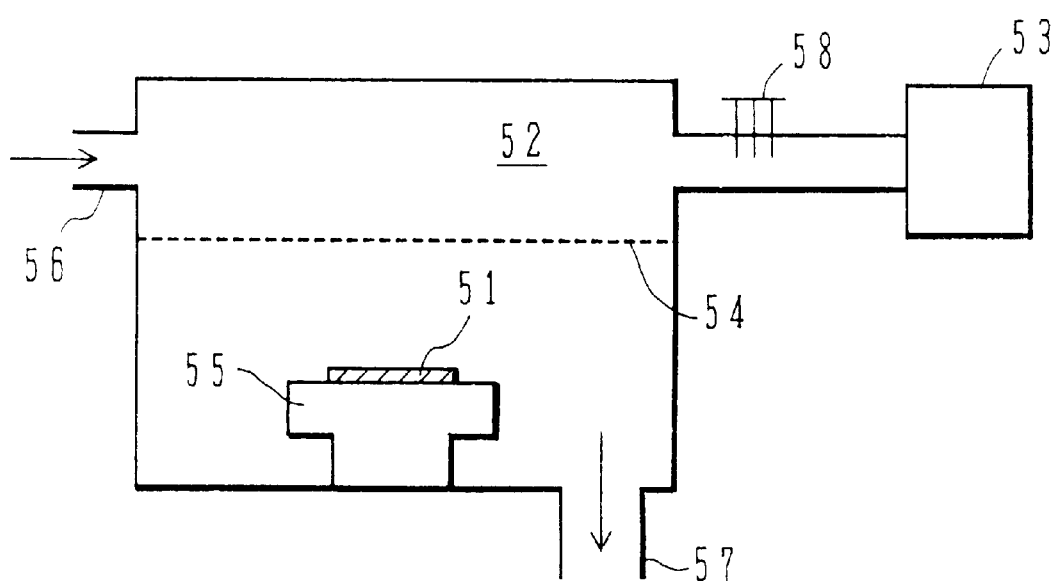
FIG. 34 is a schematic cross sectional view showing the structure of a plasma reaction system.

FIG. 34 is a schematic diagram showing the structure of a plasma reaction system. A wafer 51 having an exposed and developed resist mask formed on the surface thereof is placed on a stage 55. A shielding plate 54 is disposed above the stage 55 to electrically shield the wafer 51. The shielding plate 54 may be a wire-netted or meshed plate and can freely pass gas therethrough.

A plasma chamber 52 is formed above the shielding plate 54 into which chamber plasma generated by a magnetron 53 is supplied via a tuner 58. A reaction gas such as acetyl chloride is supplied from a reaction gas inlet port 56.

In the plasma chamber 52, the supplied plasma gas is excited by microwaves generated by the magnetron 53 to generate plasma. The generated plasma is supplied via the shielding plate 54 onto the wafer 51 as radicals. The plasma is thereafter drained from an exhaust port 57.

F-based plasma is generated while the substrate 51 is heated to 70° C. and $NF_3$ is supplied from the reaction gas inlet port 56. The wafer 51 is exposed to F-based plasma for 5 minutes to react F-based plasma with the resist film on the wafer 51.

An increased volume of the resist film after the reaction was clearly observed. It is hypothesized that hydroxyl-groups contained in the resist film were reacted with plasma. The size of a hole formed in the resist pattern was reduced.

As described so far, the size of an opening in a resist pattern can be reduced by subjecting the exposed resist pattern to a chemical reaction and expanding its volume.

As a reactant, a carboxylic acid halide may be used which is represented by R—CO—X (where R is an organic group having carbon atoms of 1 to 20, and X is a halogen element). A typical example of this halide is acetyl chloride. As a reactant, a sulfonic acid halide may also be used which is represented by R—$SO_2$—X (where R is an organic group having carbon atoms of 1 to 20, and X is a halogen element). A carboxylic acid anhydride may also be used which is represented by $R_1$—CO—O—CO—$R_2$ or

(where R, $R_1$, and $R_2$ are an organic group having carbon atoms of 1 to 20). One or more of $NF_3$, $CF_4$, $F_2$, $ClF_3$, and $SF_6$ may also be used.

A hole pattern of 0.2 to 0.25 μm can be formed by exposure of i-line of a wavelength of 0.365 μm. If a KrF excimer laser having a wavelength of 0.248 μm is used, a finer hole pattern can be formed or obviously a larger pattern may be formed. Since a larger resist pattern after the exposure and development can be used, a margin of a mask and exposure precision becomes large.

The present invention has been described in connection with the preferred embodiments. The invention is not limited only to the above embodiments. For example, as the material of resist, a substance having any composition may be used so long as it can increase the volume by a chemical reaction. As a reactant with resist, any material may be used so long as it can increase the volume of resist. It is apparent to those skilled in the art that various modifications, substitutions, combinations and the like can be made without departing from the scope of the appended claims.

We claim:

1. A method of forming a resist pattern comprising the steps of:
   forming a single-layer resist film by coating resist directly on a surface of a member to be processed, the resist containing a hydroxyl-group of a phenol compound capable of increasing volume by chemical reaction;
   exposing a portion of the resist film to energy beams;
   developing the coated resist film by removing either the exposed portion or unexposed portion of the resist film to form a pattern having an opening; and
   chemically reacting gas which comprises sulfonic acid halide or carboxylic acid halide with the hydroxyl-group of a phenol compound by contacting the gas with the hydroxyl-group of a phenol compound in the resist film to change the size of the opening of the resist film, the sulfonic acid halide or carboxylic acid halide being capable of increasing the volume of the resist film by chemical reaction with the hydroxyl-group of a phenol compound.

2. A method according to claim 1, further comprising the step of heating the resist film and producing a resist flow after said reaction step.

3. A method according to claim 2, wherein said heat/flow step and said reaction step are performed at the same time.

4. A method according to claim 2, wherein said composition B includes acetyl chloride and said heat/flow step is performed at a temperature of 130° C. or higher.

5. A method of forming a resist pattern comprising the steps of:
   forming a single-layer resist film by coating resist directly on a surface of a member to be processed, the resist containing a hydroxyl-group of a phenol compound capable of increasing volume by chemical reaction;
   exposing a portion of the resist film to energy beams;
   developing the coated resist film by removing either the exposed portion or unexposed portion of the resist film to form a pattern having an opening; and
   chemically reacting by an acylation reaction gas which comprises a composition B including a carboxylic acid halide represented by R—CO—X (where R is an organic group having carbon atoms of 1 to 20 and X is halogen) with the hydroxyl-group of a phenol compound by contacting the gas with the hydroxyl-group of a phenol compound in the resist film to change the size of the opening of the resist film, the composition B being capable of increasing the volume of the resist film by chemical reaction with the hydroxyl-group of a phlenol compound.

6. A method according to claim 5, wherein said carboxylic acid halide includes acetyl chloride.

7. A method of forming a resist pattern comprising the steps of:

forming a single-layer resist film by coating resist directly on a surface of a member to be processed, the resist containing a hydroxyl-group of a phenol compound capable of increasing volume by chemical reaction;

exposing a portion of the resist film to energy beams;

developing the coated resist film by removing either the exposed portion or unexposed portion of the resist film to form a pattern having an opening; and chemically reacting by an acylation reaction gas which comprises a composition B including acetyl chloride with the hydroxyl-group of a phenol compound by contacting the gas with the hydroxyl-group of a phenol compound in the resist film to change the size of the opening of the resist film, the composition B being capable of increasing the volume of the resist film by chemical reaction with the hydroxyl-group of a phenol compound, said reaction step being performed at a temperature of 90° C. or higher.

8. A method according to claim 7, wherein said resist is novolac resist.

9. A method of forming a resist pattern comprising the steps of:

forming a single-layer resist film by coating resist directly on a surface of a member to be processed, the resist containing a hydroxyl-group of a phenol compound capable of increasing volume by chemical reaction;

exposing a portion of the resist film to energy beams;

developing the coated resist film by removing either the exposed portion or unexposed portion of the resist film to form a pattern having an opening; and chemically reacting gas which comprises a composition B, which includes sulfonic acid halide represented by R—$SO_2$—X (where R is an organic group having carbon atoms of 1 to 20, and X is a halogen element), with the hydroxyl-group of a phenol compound by contacting the gas with the hydroxyl-group of a phenol compound in the resist film to change the size of the opening of the resist film, the composition B being capable of increasing the volume of the resist film by chemical reaction with the hydroxyl-group of a phenol compound.

10. A method of forming a resist pattern comprising the steps of:

forming a single-layer resist film by coating resist directly on a surface of a member to be processed, the resist containing a composition A capable of increasing volume by chemical reaction;

exposing a portion of the resist film to energy beams;

developing the coated resist film by removing either the exposed portion or unexposed portion of the resist film to form a pattern having an opening; and chemically reacting gas containing a composition B with the composition A by contacting the gas with the composition A in the resist film to change the size of the opening of the resist film, the composition B being capable of increasing the volume of the composition A by chemical reaction with the composition A, wherein said composition B is at least one composition selected from the group consisting of $NF_3$, $CF_4$, $F_2$, $ClF_3$, and $SF_6$.

11. A method according to claim 10, wherein said reaction step is performed in a plasma atmosphere.

12. A method of forming a resist pattern comprising the steps of:

forming a single-layer resist film by coating resist directly on a surface of a member to be processed, the resist containing a hydroxyl-group of a phenol compound capable of increasing volume by chemical reaction;

exposing a portion of the resist film to energy beams;

developing the coated resist film by removing either the exposed portion or unexposed portion of the resist film to form a pattern having an opening;

applying an ultraviolet ray to the resist film after said patterning step, chemically reacting by an acylation reaction gas which comprises a composition B with the hydroxyl-group of a phenol compound by contacting the gas with the hydroxyl-group of a phenol compound in the resist film to change the size of the opening of the resist film. the composition B being capable of increasing the volume of the resist film by chemical reaction with the hydroxyl-group of a phenol compound;

wherein said reaction step of contacting the composition B is performed after or simultaneously with said step of applying an ultraviolet ray.

13. A method of manufacturing a semiconductor device comprising the steps of:

forming a semiconductor device structure on a semiconductor substrate;

forming a resist film by coating resist on a surface of the semiconductor substrate, the resist containing a phenol polymer having hydroxyl-group capable of increasing volume by chemical reaction;

exposing a portion of the resist film to energy beams;

developing the coated resist film by removing either the exposed portion or an unexposed portion of the resist film to form a pattern having an opening; and chemically reacting by an acylation or a sulfonyl esterification reaction fluid containing gas which comprises a sulfonic acid halide or carboxylic acid halide with the polymer by contacting the gas with the polymer to change the size of the opening of the resist film, the sulfonic acid halide or carboxylic acid halide being capable of increasing the volume of the resist film by chemical reaction with the polymer; and processing the semiconductor substrate using said resist film.

14. A method according to claim 13, wherein said semiconductor device structure has a conductive member and an insulating layer covering said conductive member.

15. A method according to claim 14, wherein said conductive member is an insulated gate electrode, and said semiconductor substrate comprises a pair of source/drain regions disposed to sandwich said gate electrode.

16. A method of forming a resist pattern comprising the steps of:

forming a resist film by coating resist on a surface of a member to be processed, the resist containing a composition A capable of increasing volume by chemical reaction;

exposing a portion of the resist film to energy beams;

developing the coated resist film by removing either the exposed portion or unexposed portion of the resist film to form a pattern having an opening; and chemically reacting fluid containing acetyl chloride with the composition A by contacting the fluid with the composition A to change the size of the opening of the resist film, the fluid containing acetyl chloride being capable of increasing the volume of the composition A by chemical reaction with the composition A.

17. A method of forming a resist pattern comprising the steps of:

forming a resist film by coating resist on a surface of a member to be processed, the resist containing a composition A capable of increasing volume by chemical reaction;

exposing a portion of the resist film to energy beams;

developing the coated resist film by removing either the exposed portion or unexposed portion of the resist film to form a pattern having an opening; and chemically reacting fluid containing acetyl chloride with the composition A by contacting the fluid with the composition A at a temperature of 90° C. or higher to change the size of the opening of the resist film, the fluid containing acetyl chloride being capable of increasing the volume of the composition A by chemical reaction with the composition A.

18. A method of forming a resist pattern comprising the steps of:

forming a resist film by coating resist on a surface of a member to be processed, the resist containing a composition A capable of increasing volume by chemical reaction;

exposing a portion of the resist film to energy beams;

developing the coated resist film by removing either the exposed portion or unexposed portion of the resist film to form a pattern having an opening;

chemically reacting fluid containing acetyl chloride with the composition A by contacting the fluid with the composition A to change the size of the opening of the resist film, the fluid containing acetyl chloride being capable of increasing the volume of the composition A by chemical reaction with the composition A, and after chemically reacting, heating the resist film at a temperature of 130° C. or higher and producing a resist flow.

19. A method of forming a resist pattern comprising the steps of:

forming a resist film by coating resist on a surface of a member to be processed, the resist containing a composition A capable of increasing volume by chemical reaction;

exposing a portion of the resist film to energy beams;

developing the coated resist film by removing either the exposed portion or unexposed portion of the resist film to form a pattern having an opening; and chemically reacting fluid containing sulfonic acid halide represented by $R-SO_2-X$ (where R is an organic group having carbon atoms of 1 to 20, and X is a halogen element) with the composition A by contacting the fluid with the composition A to change the size of the opening of the resist film, the fluid being capable of increasing the volume of the composition A by chemical reaction with the composition A.

20. A method of manufacturing a semiconductor device comprising the steps of:

forming a semiconductor device structure on a semiconductor substrate;

forming a resist film by coating resist on a surface of the semiconductor substrate, the resist containing a phenol polymer having hydroxyl-group capable of increasing volume by chemical reaction;

exposing a portion of the resist film to energy beams;

developing the coated resist film by removing either the exposed portion or an unexposed portion of the resist film to form a pattern having an opening; and chemically reacting by an acylation or a sulfonyl esterification reaction fluid containing gas which comprises a sulfonic acid halide or carboxylic acid halide with the polymer by contacting the gas with the polymer to change the size of the opening of the resist film, the sulfonic acid halide or carboxylic acid halide being capable of increasing the volume of the resist film by chemical reaction with the polymer;

after chemically reacting, heating the resist film and producing a resist flow; and processing the semiconductor substrate using said resist film.

\* \* \* \* \*